United States Patent
Myung et al.

(10) Patent No.: US 9,362,952 B2
(45) Date of Patent: Jun. 7, 2016

(54) APPARATUSES AND METHODS FOR ENCODING AND DECODING OF PARITY CHECK CODES

(71) Applicant: SAMSUNG ELECTRONICS CO., LTD., Suwon-si (KR)

(72) Inventors: Se-ho Myung, Yongin-si (KR); Hong-sil Jeong, Suwon-si (KR); Kyung-joong Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 42 days.

(21) Appl. No.: 14/303,856

(22) Filed: Jun. 13, 2014

(65) Prior Publication Data

US 2014/0372826 A1 Dec. 18, 2014

Related U.S. Application Data

(60) Provisional application No. 61/862,633, filed on Aug. 6, 2013, provisional application No. 61/839,080, filed on Jun. 25, 2013, provisional application No. 61/835,084, filed on Jun. 14, 2013.

(30) Foreign Application Priority Data

May 15, 2014 (KR) .................. 10-2014-0058323

(51) Int. Cl.
*H03M 13/00* (2006.01)
*H03M 13/11* (2006.01)
*H03M 13/03* (2006.01)

(52) U.S. Cl.
CPC ........ *H03M 13/1165* (2013.01); *H03M 13/036* (2013.01)

(58) Field of Classification Search
CPC .......... H03M 13/1165; H03M 13/036; H03M 13/255; H03M 13/6552; H03M 13/271; H03M 13/2707; H03M 13/1185
USPC .................................................. 714/758, 759
See application file for complete search history.

(56) References Cited

U.S. PATENT DOCUMENTS

| | | | |
|---|---|---|---|
| 7,502,987 B2 | 3/2009 | Kyung et al. | |
| 8,190,981 B2 * | 5/2012 | Jeong | H03M 13/1165 714/746 |

(Continued)

FOREIGN PATENT DOCUMENTS

| | | |
|---|---|---|
| EP | 2536030 A1 | 12/2012 |
| JP | 2012151520 A | 8/2012 |
| KR | 10-2005-0118056 A | 12/2005 |
| WO | 2012099398 A2 | 7/2012 |

OTHER PUBLICATIONS

International Search Report dated Oct. 8, 2014 issued by International Searching Authority in counterpart International Patent Application No. PCT/KR2014/005203.

(Continued)

*Primary Examiner* — Christine Tu
(74) *Attorney, Agent, or Firm* — Sughrue Mion, PLLC

(57) ABSTRACT

An encoding apparatus is provided. The encoding apparatus includes: a low density parity check (LDPC) encoder configured to generate an LDPC codeword formed of 16200 bits by performing LDPC encoding based on a parity check matrix, wherein the parity check matrix includes an information word sub-matrix and a parity sub-matrix, the information word sub-matrix being formed of a plurality of column groups each including 360 columns and being defined as a table indicating a position of one (1) present in each 360-th column.

20 Claims, 11 Drawing Sheets

(56) References Cited

U.S. PATENT DOCUMENTS

| | | | |
|---|---|---|---|
| 8,972,834 B2* | 3/2015 | Eroz | H04L 1/00 714/790 |
| 9,135,108 B2* | 9/2015 | Shinohara | G06F 11/10 |
| 2009/0070652 A1 | 3/2009 | Myung et al. | |
| 2011/0047435 A1 | 2/2011 | Eroz et al. | |
| 2013/0297992 A1 | 11/2013 | Yamamoto et al. | |

OTHER PUBLICATIONS

Written Opinion dated Oct. 8, 2014 issued by International Searching Authority in counterpart International Patent Application No. PCT/KR2014/005203.

* cited by examiner

APPARATUSES AND METHODS FOR ENCODING AND DECODING OF PARITY CHECK CODES

CROSS-REFERENCE TO RELATED APPLICATIONS

This application claims priority from Korean Patent Application No. 10-2014-0058323, filed on May 15, 2014, in the Korean Intellectual Property Office, and U.S. Provisional Application No. 61/862,633, filed on Aug. 6, 2013, U.S. Provisional Application No. 61/839,080, filed on Jun. 25, 2013, and U.S. Provisional Application No. 61/835,084, filed on Jun. 14, 2013, in the USPTO, the disclosures of which are incorporated herein by reference in their entirety.

BACKGROUND

1. Field

Apparatuses and methods consistent with exemplary embodiments relate to encoding and decoding of parity check codes, and more particularly, to encoding and decoding of parity check codes capable of performing low density parity check (LDPC) encoding and decoding based on a parity check matrix.

2. Description of the Related Art

In a communication/broadcasting system, link performance may be significantly deteriorated due to several types of noise in a channel, a fading phenomenon, and inter-symbol interference (ISI). Therefore, in order to implement high speed digital communication/broadcasting systems requiring a high data throughput and reliability, such as the next generation mobile communication, digital broadcasting and portable Internet, it has been required to develop a technology to address problems occurring from the noise, fading, ISI, etc. Studies on an error correcting code has been recently conducted actively as a method for increasing reliability of communication by efficiently reconstructing distorted information.

In the 1960s, an LDPC code initially introduced by Gallager has been forgotten for a long time due to technological complexity of the LDPC code that could not be implemented by a technology level in those days. However, as a turbo code suggested by Berrou, Glavieux, and Thitimajshima in 1993 shows performance approaching a channel capacity of Shannon, many analyses for performance and features of the turbo code have been conducted. Therefore, many studies on channel encoding based on a graph and iterative decoding have been conducted. As a result, the LDPC code was again studied in the latter half of the 1990s, such that is has been revealed that the performance approaches the channel capacity of the Shannon when decoding is performed by applying iterative decoding based on a sum-product algorithm on a Tanner graph corresponding to the LDPC code.

The LDPC code is generally defined as a parity check matrix and may be represented by a bipartite graph commonly called a Tanner graph.

Hereinafter, a systematic LDPC codeword will be described with reference to FIG. 1. The LDPC codes are LDPC encoded by receiving an information word 102 formed of $K_{ldpc}$ bits or symbols to generate a codeword 100 formed of $N_{ldpc}$ bits or symbols. Hereinafter, for convenience of explanation, it is assumed that the codeword 100 formed of $N_{ldpc}$ bits is generated by receiving the information word 102 including $K_{ldpc}$ bits. That is, when the information word $I=[i_0, i_1, i_2, \ldots, i_{K_{ldpc}-1}]$ 102 which is formed of $K_{ldpc}$ input bits is LDPC encoded, the codeword $c=[c_0, c_1, c_2, c_3, \ldots, c_{N_{ldpc}-1}]$ 100 is generated. That is, the codeword is a bit string formed of a plurality of bits and the bits of the codeword represent each bit forming the codeword. Further, the information word is a bit string formed of a plurality of bits and the bits of the information word represent each bit forming the information word. In this case, in the case of a systematic code, the codeword is formed of $C=[c_0, c_1, c_2, \ldots, c_{N_{ldpc}-1}]=[i_0, i_1, i_2, \ldots, i_{K_{ldpc}-1}, p_0, p_1, p_2, \ldots, p_{N_{ldpc}-K_{ldpc}-1}]$. Here, $P=[p_0, p_1, p_2, \ldots, p_{N_{ldpc}-K_{ldpc}-1}]$ is a parity 104 and the number $N_{parity}$ of parity bits is as follows. $N_{parity}=N_{ldpc}-K_{ldpc}$.

The LDPC codes are a kind of linear block codes and include a process of determining a codeword satisfying conditions of following mathematical expression 1.

$$H \cdot c^T = [h_0 h_1 h_2 \ldots h_{N_{ldpc}-1}] \cdot c^T = \sum_{i=0}^{N_{ldpc}-1} c_i \cdot h_i = 0, \quad (1)$$

where $$c = [c_0, c_1, c_2, \ldots, c_{N_{ldpc}-1}].$$

In mathematical expression 1 above, H represents the parity-check matrix, C represents the codeword, $c_i$ represents an i-th bit of the codeword, and $N_{ldpc}$ represents a codeword length. Here, $h_i$ represents an i-th column of the parity-check matrix H.

The parity-check matrix H is formed of the same $N_{ldpc}$ columns as the number of bits of the LDPC codeword. The mathematical expression 1 represents that since a sum of a product of the i-th column $h_i$ of the parity-check matrix and the i-th bit $c_i$ of the codeword becomes "0", the i-th column $h_i$ has a relationship with the i-th bit $c_i$ of the codeword.

Meanwhile, the performance of the LDPC codes may be determined according to the parity-check matrix. Therefore, there is a need to design the parity-check matrix for the LDPC codes having improved performance.

SUMMARY

One or more exemplary embodiments of the inventive concept may overcome the above disadvantages and other disadvantages not described above. However, these embodiments are not required to overcome the disadvantages and any of the problems described above.

One or more exemplary embodiments provide apparatuses and methods for encoding and decoding of parity check codes capable of improving LDPC encoding and decoding performance.

According to an aspect of an exemplary embodiment, there is provided an encoding apparatus for performing low density parity check (LDPC) encoding which may include: an LDPC encoder configured to generate an LDPC codeword formed of 16200 bits by performing LDPC encoding based on a parity check matrix, wherein the parity check matrix includes an information word sub-matrix and a parity sub-matrix, the information word sub-matrix being formed of a plurality of column groups each including 360 columns and being defined as a table indicating a position of one (1) present in each 360-th column.

The LDPC encoder may perform the LDPC encoding using a parity check matrix defined as a table such as Table 6 when a code rate of an LDPC code is 7/15.

The LDPC encoder may perform the LDPC encoding using a parity check matrix defined as a table such as Table 10 when the code rate is 5/15.

The LDPC encoder may perform the LDPC encoding using a parity check matrix defined as a table such as Table 11 when the code rate is 9/15.

The LDPC encoder may perform the LDPC encoding using a parity check matrix defined as a table such as Table 13 when the code rate is 11/15.

The LDPC encoder may perform the LDPC encoding using a parity check matrix defined as a table such as Table 14 when the code rate is 13/15.

According to an aspect of another exemplary embodiment, there is provided an encoding method for performing LDPC encoding which may include: generating an LDPC codeword formed of 16200 bits by performing the LDPC encoding on input bits based on a parity check matrix, wherein the parity check matrix includes an information word sub-matrix and a parity sub-matrix, and the information word sub-matrix has a plurality of column groups each including 360 columns and being defined as a table indicating positions of one (1) present in each 360-th column.

In the generating the LDPC codeword, the LDPC encoding may be performed using a parity check matrix defined as a table such as Table 6 when the code rate is 7/15.

In the generating the LDPC codeword, the LDPC encoding may be performed using a parity check matrix defined as a table such as Table 10 when the code rate is 5/15.

In the generating the LDPC codeword, the LDPC encoding may be performed using a parity check matrix defined as a table such as Table 11 when the code rate is 9/15.

In the generating the LDPC codeword, the LDPC encoding may be performed using a parity check matrix defined as a table such as Table 13 when the code rate is 11/15.

In the generating the LDPC codeword, the LDPC encoding may be performed using a parity check matrix defined as a table such as Table 14 when the code rate is 13/15.

According to an aspect of still another exemplary embodiment, there is provided a decoding apparatus for performing LDPC decoding which may include: an LDPC decoder configured to perform the LDPC decoding on an LDPC codeword formed of 16200 bits based on a parity check matrix, wherein the parity check matrix includes an information word sub-matrix and a parity sub-matrix, and wherein the information word sub-matrix has a plurality of column groups each including 360 columns and being defined as a table indicating positions of one (1) present in each 360-th column.

The LDPC decoder may perform the LDPC decoding using a parity check matrix defined as a table such as Table 6 when the code rate is 7/15.

The LDPC decoder may perform the LDPC decoding using a parity check matrix defined as a table such as Table 10 when the code rate is 5/15.

The LDPC decoder may perform the LDPC decoding using a parity check matrix defined as a table such as Table 11 when the code rate is 9/15.

The LDPC decoder may perform the LDPC decoding using a parity check matrix defined as a table such as Table 14 when the code rate is 11/15.

The LDPC decoder may perform the LDPC decoding using a parity check matrix defined as a table such as Table 14 when the code rate is 13/15.

According to yet still another aspect of the present invention, a decoding method for performing LDPC decoding includes: performing the LDPC decoding on an LDPC codeword formed of 16200 bits based on a parity check matrix, wherein the parity check matrix includes an information word sub-matrix and a parity sub-matrix, and wherein the information word sub-matrix comprises a plurality of column groups each including 360 columns and being defined as a table indicating positions of one (1) present in each 360-th column.

In the performing of the LDPC decoding, the LDPC decoding may be performed using a parity check matrix defined as a table such as Table 6 when the code rate is 7/15.

In the performing of the LDPC decoding, the LDPC decoding may be performed using a parity check matrix defined as a table such as Table 10 when the code rate is 5/15.

In the performing of the LDPC decoding, the LDPC decoding may be performed using a parity check matrix defined as a table such as Table 11 when the code rate is 9/15.

In the performing of the LDPC decoding, the LDPC decoding may be performed using a parity check matrix defined as a table such as Table 13 when the code rate is 11/15.

In the performing of the LDPC decoding, the LDPC decoding may be performed using a parity check matrix defined as a table such as Table 14 when the code rate is 13/15.

Additional and/or other aspects and advantages of the exemplary embodiments will be set forth in part in the description which follows and, in part, will be obvious from the description, or may be learned by practice of these embodiments.

BRIEF DESCRIPTION OF THE DRAWING FIGURES

The above and/or other aspects of the inventive concept will be more apparent by describing certain exemplary embodiments with reference to the accompanying drawings, in which.

DETAILED DESCRIPTION OF THE EXEMPLARY EMBODIMENTS

Hereinafter, exemplary embodiments will be described in detail with reference to the accompanying drawings. Further, when it is determined that the detailed descriptions of the known function or configuration related to the exemplary embodiments may obscure the gist of the inventive concept, the detailed descriptions thereof will be omitted.

Hereinafter, low density parity check (LDPC) encoding and decoding technologies in a communication/broadcasting system according to exemplary embodiments will be described.

In the following exemplary embodiments, terms and names defined in the Digital Video Broadcasting the Second Generation Terrestrial (DVB-T2) system, which is one of the European digital broadcasting standards, and a North America digital broadcasting standard system (Advanced Television Systems Committee (ATSC) 3.0) will be used. However, the inventive concept is not limited to these terms and names, but may be similarly applied to other systems.

A graph representation method of an LDPC code will be described with reference to FIG. 2.

Figure 1:
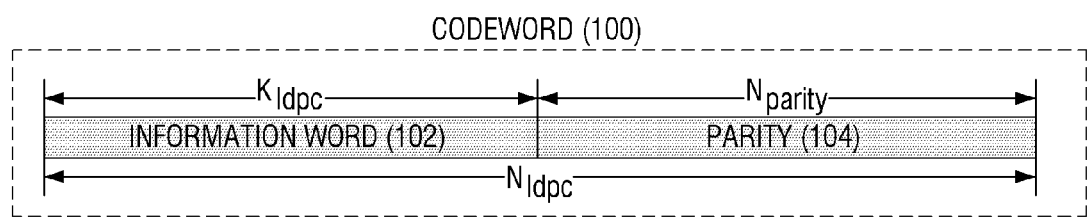
FIG. 1 is a diagram showing a codeword of a systematic low density parity check (LDPC) code.
Figure 2:
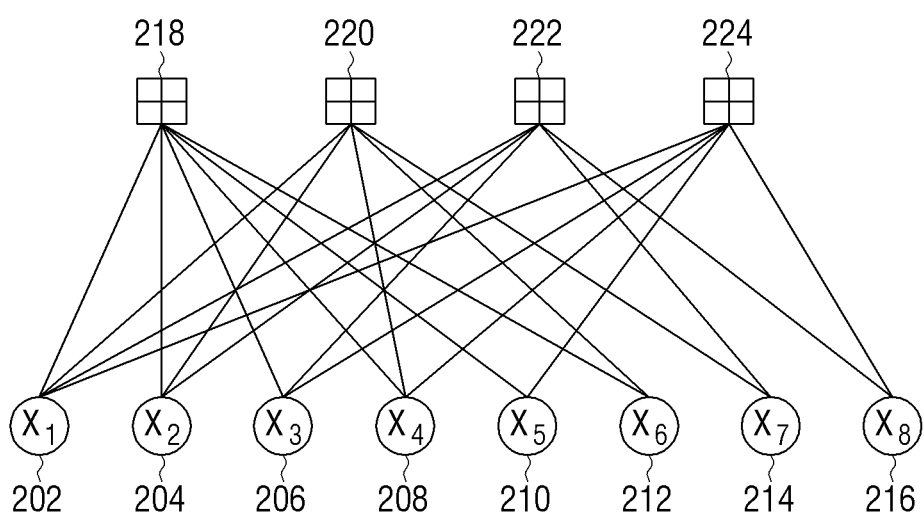
FIG. 2 is a diagram showing a parity check matrix and a factor graph of a general (8, 2, 4) LDPC code.

FIG. 2 is a diagram showing an example of a parity check matrix $H_1$ of an LDPC code configured of four (4) rows and eight (8) columns and a Tanner graph thereof. Referring to FIG. 2, since the parity check matrix $H_1$ has eight (8) columns, it generates a codeword having a length of eight (8), a code generated through $H_1$ means an LDPC code, and each column corresponds to encoded eight (8) bits.

Referring to FIG. 2, a Tanner graph of the LDPC code encoded and decoded based on the parity check matrix $H_1$ is configured of eight (8) variable nodes, that is, $x_1(202)$, $x_2(204)$, $x_3(206)$, $x_4(208)$, $x_5(210)$, $x_6(212)$, $x_7(214)$ and $x_8(216)$ and four (4) check nodes 218, 220, 222 and 224. Here, an i-th column and a j-th row of the parity check matrix $H_1$ of the LDPC code correspond to a variable node $x_i$ and a j-th check node, respectively. In addition, the meaning of a value one (1) (that is, a value that is not zero (0)) of a point at which a j-th column and j-th row of the parity check matrix $H_1$ of the LDPC code intersect with each other is that an edge connecting the variable node $x_i$ and the j-th check node to each other is present on the Tanner graph as shown in FIG. 2.

Degrees of variable nodes and check nodes in the Tanner graph of the LDPC code mean the number of edges connected to the respective nodes, which is the number of entries that are not zero (0) in a column or a row corresponding to a corresponding node in the parity check matrix of the LDPC code. For example, in FIG. 2, degrees of the variable nodes $x_1(202)$, $x_2(204)$, $x_3(206)$, $x_4(208)$, $x_5(210)$, $x_6(212)$, $x_7(214)$ and $x_8(216)$ are sequentially 4, 3, 3, 3, 2, 2, 2 and 2, respectively, and degrees of the check nodes 218, 220, 222 and 224 are sequentially 6, 5, 5 and 5, respectively. In addition, the numbers of entries that are not zero (0) in the respective columns of the parity check matrix $H_1$ of FIG. 2 corresponding to the variable nodes of FIG. 2 sequentially coincide with the above-mentioned degrees 4, 3, 3, 3, 2, 2, 2 and 2, and the numbers of entries that are not zero (0) in the respective rows of the parity check matrix $H_1$ of FIG. 2 corresponding to the check nodes of FIG. 2 sequentially coincide with the above-mentioned degrees 6, 5, 5 and 5.

As described above, an i-th bit $c_i$ of the LDPC codeword is associated with an i-th column of the parity check matrix and corresponds to an i-th variable node of the Tanner graph. Therefore, performance of the i-th bit may be determined depending on positions and the number of ones (1s) in the i-th column of the parity check matrix. Therefore, performance of $N_{ldpc}$ codeword bits of the codeword depends on the positions and the number of ones (1s) in the parity check matrix.

Hereinafter, a feature of a parity check matrix of an LDPC code having a specific structure will be described with reference to FIG. 3.

Figure 3:
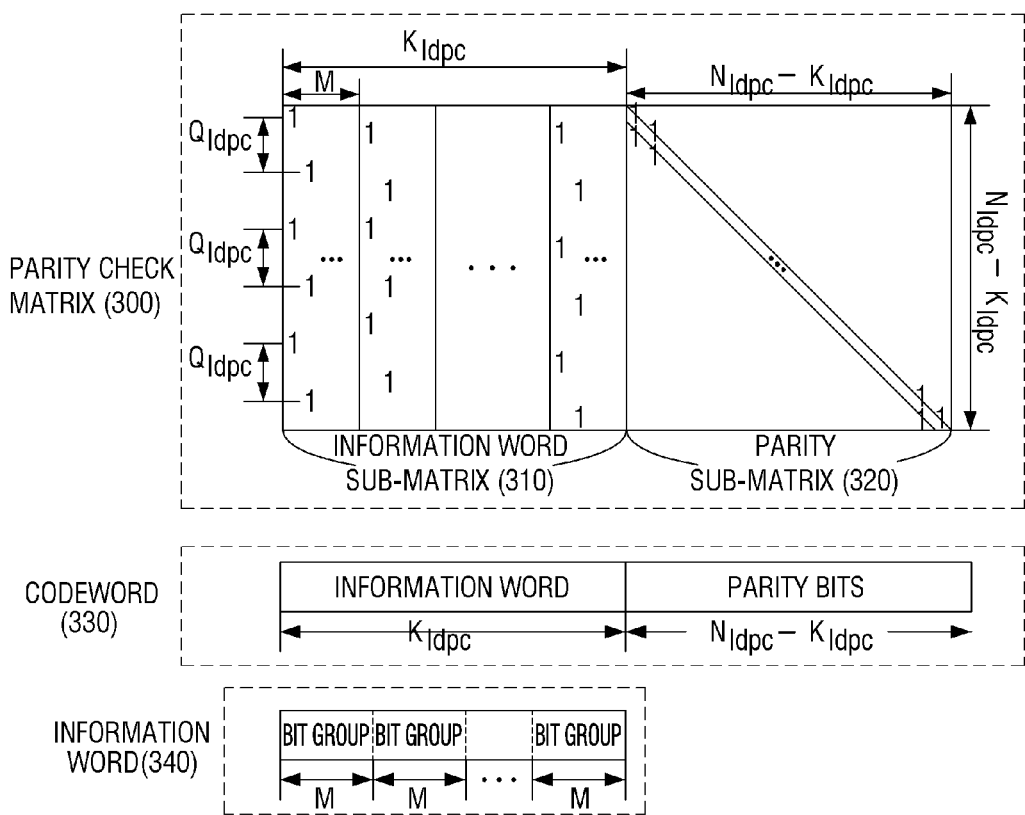
FIG. 3 is a diagram showing a parity check matrix according to an exemplary embodiment.

According to an exemplary embodiment, a parity check matrix having a structure as shown in FIG. 3 will be considered. The parity check matrix shown in FIG. 3 has a systematic structure in which a codeword includes an information word as it is. Hereinafter, although the inventive concept will be described based on a parity check matrix of FIG. 3, an applicable range of the inventive concept is not limited to the parity check matrix as shown in FIG. 3.

In FIG. 3, $N_{ldpc}$ means a length of an LDPC codeword, and $K_{ldpc}$ means a length of an information word. The length of the codeword or the information word means the number of bits included in the codeword or the information word. M is an interval at which patterns of columns in a sub-matrix 310 (hereinafter, referred to as an information word sub-matrix) corresponding to the information word are repeated, and $Q_{ldpc}$ is a magnitude at which each column in the information word sub-matrix 310 is cyclically shifted. Values of the integers M and $Q_{ldpc}$ are determined to satisfy an equation: $Q_{ldpc}=(N_{ldpc}-K_{ldpc})/M$. Here, $K_{ldpc}/M$ is also an integer. Values of M and $Q_{ldpc}$ may be changed depending on a length and a code rate (or coding rate) of the codeword.

Referring to FIG. 3, the parity check matrix 300 is divided into the information word sub-matrix 310 and a sub-matrix 320 (hereinafter, referred to as a parity sub-matrix) corresponding to a parity. The information word sub-matrix 310 includes $K_{ldpc}$ columns, and the parity sub-matrix 320 includes $N_{parity}=N_{ldpc}-K_{ldpc}$ columns. The number of rows of the parity check matrix 300 is the same as that $(N_{ldpc}-K_{ldpc})$ of columns of the parity sub-matrix 320.

In the parity sub-matrix 320 including a $K_{ldpc}$-th column to an $N_{ldpc}-1$-th column of the parity check matrix 300, positions of entries having a weight-1, that is, a value of one (1), have a dual diagonal structure. Therefore, all of degrees (here, the degree is the number of ones (1s) included in each column) of columns other than the $(N_{ldpc}-1)$-th column among columns included in the parity sub-matrix 320 are two (2), and a degree of the $(N_{ldpc}-1)$-th column is one (1).

Referring to FIG. 3, a structure of the information word sub-matrix 310, that is, a sub-matrix including a zero (0)-th column to a $(K_{ldpc}-1)$-th column, in the parity check matrix 300 follows the following rules.

First, $K_{ldpc}$ columns corresponding to the information word in the parity check matrix 300 belong to a plurality of column groups or blocks each having M columns, and are divided into a total of $K_{ldpc}/M$ column groups. Columns belonging to the same column group have a relationship in which they are shifted from a previous column by $Q_{ldpc}$.

Second, when it is assumed that a degree of a zero (0)-th column of an i-th (i=0, 1, ..., $K_{ldpc}/M-1$) column group is $D_i$ and positions of the respective rows at which one (1) is present are $R_{i,0}^{(0)}$, $R_{i,0}^{(1)}$, ..., $R_{i,0}^{(D_i-1)}$, an index $R_{i,j}^{(k)}$ of a row at which a weight-1 is positioned in a j-th column within the i-th column group is determined as represented by following mathematical expression 2.

$$R_{i,j}^{(k)}=(R_{i,(j-1)}^{(k)}+Q_{ldpc}) \bmod (N_{ldpc}-K_{ldpc}) \qquad (2),$$

where k=0, 1, 2, ..., $D_i-1$, i=0, 1, ..., $K_{ldpc}/M-1$, and j=1, 2, ..., M−1.

Meanwhile, above mathematical expression 2 may be represented by the following mathematical expression 3.

$$R_{i,j}^{(k)}=\{R_{i,0}^{(k)}+(j \bmod M) \times Q_{ldpc}\} \bmod (N_{ldpc}-K_{ldpc}) \qquad (3),$$

where k=0, 1, 2, ..., $D_i-1$, i=0, 1, ..., $K_{ldpc}/M-1$, and j=1, 2, ..., M−1.

In the above mathematical expressions, $R_{i,j}^{(k)}$ means an index of a row at which a k-th weight-1 is present in the j-th column within the i-th column group, $N_{ldpc}$ means a length of the LDPC codeword, $K_{ldpc}$ means a length of the information word, $D_i$ means a degree of columns belonging to the i-th column group, and M means the number of columns belonging to one column group.

According to these mathematical expressions, when only a value of $R_{i,0}^{(k)}$ is recognized, an index of a row at which the k-th weight-1 is present within the i-th column group may be recognized. Therefore, when an index values of a row at which the k-th weight-1 is present in a zero (0)-th column within each column group is stored, positions of a column and a row at which the weight-1 is present in the parity check matrix 300 (that is, the information word sub-matrix 310 of the parity check matrix 300) having the structure shown in FIG. 3 may be recognized.

According to the above-mentioned rules, all of the degrees of the columns belonging to the i-th column group are the same $D_i$. Meanwhile, according to the above-mentioned rules, the LDPC code in which information on the parity check matrix 300 is stored may be simply represented as follows.

As a specific example, in the case in which $N_{ldcp}$ is 30, $K_{ldpc}$ is 15, and $Q_{ldpc}$ is three (3), information on positions of rows at which the weight-1 is positioned in zero (0)-th columns within three column groups may be represented by sequences as represented by following mathematical expression 4. The sequences as represented by following mathematical expression 4 may be called a weight-1 position sequence.

$$R_{1,0}^{(1)}=1, R_{1,0}^{(2)}=2, R_{1,0}^{(3)}=8, R_{1,0}^{(4)}=10,$$

$$R_{2,0}^{(1)}=0, R_{2,0}^{(2)}=9, R_{2,0}^{(3)}=13,$$

$$R_{3,0}^{(1)}=0, R_{3,0}^{(2)}=14. \quad (4)$$

In above mathematical expression 4, $R_{i,j}^{(k)}$ means an index of a row at which the k-th weight-1 is present in the j-th column within the i-th column group.

The weight-1 position sequences as represented by above mathematical expression 4, which indicates indices of the rows at which one (1) is positioned in the zero (0)-th columns of the respective column groups, may be more simply represented by following Table 1.

TABLE 1

1 2 8 10
0 9 13
0 14

In Table 1 showing positions of entries having a weight-1, that is, a value of one (1), in the parity check matrix, an i-th weight-1 position sequence may be represented by indices of rows at which the weight-1 is present in the zero (0)-th column belonging to the i-th column group.

The LDPC code suggested in the present embodiment is characterized in that it is grouped in a unit of M columns in the parity check matrix as described above to have a specific form. One column group configured of M columns in the parity check matrix 300 corresponds to an information bit group 340 of the information word in the codeword 330 of FIG. 3 having M bits. In other words, a term 'column group' used in the present embodiment means that grouping was performed on the parity check matrix, and a term 'bit group' means that grouping was performed on the codeword. In addition, it is to be noted that the column group and the bit group have a one-to-one corresponding relationship therebetween.

Performance of the LDPC code may be changed depending on the positions and the number of the weight-1s configuring the parity check matrix. In other words, when it is assumed that a size of the parity check matrix is determined for a given codeword length, a code rate, and the like, the performance of the LDPC code may be changed depending on the positions and the number of the weight-1s configuring the parity check matrix. In addition, the number of weight-1s is closely related to complexity of encoding and decoding of the LDPC code.

Therefore, in the case in which the size of a parity check matrix is determined for a given codeword length, code rate, and the like, it is an important process in designing an excellent LDPC code to appropriately determine the number and the positions of weight-1s.

In the present embodiment, a design method of an LDPC code grouped in a unit of M columns as shown in FIG. 3 is suggested, and encoding and decoding apparatuses using the LDPC code designed by this method are suggested.

The following conceptually and sequentially shows a process for a design method of an LDPC code according to an exemplary embodiment.

Step 1) a size ($N_{ldpc}$, $K_{ldpc}$) of a parity check matrix to be designed and a value of M (or $Q_{ldpc}$) are determined. It means that the parity check matrix is configured of $N_{ldpc}$ columns and $N_{ldpc}-K_{ldpc}$ rows. In addition, it is to be noted that a structure of the parity check matrix to be designed should be the same as that of the parity check matrix 300 of FIG. 3. For example, the parity check matrix has a staircase structure in which degrees of $N_{ldpc}-K_{ldpc}-1$ columns are two (2) and a degree of one column is one (1), as in the parity sub-matrix 320 of the parity check matrix 300 of FIG. 3.

Step 2) a size and a structure of a mother matrix (or mother parity check matrix) for designing the parity check matrix having the size determined in Step 1 are set. A size of the mother matrix is configured of $N_{ldpc}/M$ columns and $(N_{ldpc}-K_{ldpc})/M$ rows, and a parity portion has the same structure as that of the parity check matrix 300 of FIG. 3. That is, the parity portion has a staircase structure in which degrees of $N_{ldpc}-K_{ldpc}-1$ columns are two (2) and a degree of one column is one (1), as in the parity sub-matrix 320 of the parity check matrix 300 of FIG. 3.

Step 3) an appropriate degree distribution is found in order to design the mother matrix. As a typical method for finding the degree distribution, density evolution (reference: Richardson, T., and URBANKE, R.: 'The capacity of low-density parity-check codes under message-passing decoding', IEEE Trans. Inf. Theory, 2001, 47, (2), pp. 599-618) may be used. When the degree distribution is found, it is to be noted that the number of columns having a degree of two (2) is fixed to $(N_{ldpc}-K_{ldpc})/M-1$ and the number of columns having a degree of one (1) is fixed to one (1).

Step 4) the mother matrix is designed so as to satisfy the degree distribution found in Step 3. The mother matrix is designed in consideration of cycle characteristics in an order of low degrees.

Step 5) a final parity check matrix is designed from the mother matrix. As a method of designing the final parity check matrix, a lifting method in which the cycle characteristics are considered from the mother matrix is used.

Hereinafter, the lifting method described in Step 5 will be described in more detail.

The lifting method is a method that may relatively simply generate a parity check matrix having a larger size based on a parity check matrix having a small size. For example, when a parity check matrix $H_1$ including column groups configured in a unit of $M_1$ columns and having a total number of columns corresponding to $N_1$ and the number of rows corresponding to $N_1-K_1$ is given, a parity check matrix $H_2$ including column groups configured in a unit of $M_2$ columns and having a total number of columns corresponding to $N_2$ and the number of rows corresponding to $N_2-K_2$ may be obtained by the lifting method.

Here, the following relationship: $N_2/N_1=(N_2-K_2)/(N_1-K_1)=M_2/M_1=A$ (A indicates a positive integer larger than one (1)) is satisfied. Here, it is to be noted that $Q_{ldpc1}=(N_1-K_1)/M_1=(N_2-K_2)/M_2=Q_{ldpc2}$.

Hereinafter, a process of generating the parity check matrix $H_2$ larger than the given parity check matrix $H_1$ from the parity check matrix $H_1$ by applying the lifting while maintaining the structure of FIG. 3 will be described.

It is assumed that a sequence indicating information on an i-th column group corresponding to an information word bit of the given parity check matrix $H_1$ is $R_{i,0}^{(0)}, R_{i,0}^{(1)}, \ldots, R_{i,0}^{(D_i-1)}$ in order to describe the lifting process. Here, $i=0, 1, \ldots, K_1/M_1-1$, and $D_i$ means a degree of columns belonging to the i-th column group.

Lifting Step 1) a matrix having the same structure as that of a sub-matrix corresponding to the parity portion of FIG. 3 and having a size of $(N_2-K_2) \times (N_2-K_2)$ is set to a parity sub-matrix corresponding to a parity portion of $H_2$.

Step 2) i is initialized to zero (0).

Step 3) for each of sequences $R_{i,0}^{(k)}$ (k=0, 1, 2, ..., $D_i$−1) indicating the information on the i-th column group corresponding to the information word bit of the parity check matrix $H_1$, a set $B_i^{(k)} = \{R_{i,0}^{(k)}, R_{i,0}^{(k)}+(N_1-K_1), \ldots, R_{i,0}^{(k)}+(A-1)\times(N_1-K_1)\}$ configured of A sequences is defined as follows. Here, A is a positive integer satisfying $N_2/N_1=(N_2-K_2)/(N_1-K_1)=M_2/M_1=A$.

Step 4) sequences $S_{i,0}^{(k)}$ (k=0, 1, 2, ..., $D_i$−1) satisfying following <condition 1> and <condition 2> are sequentially found on an assumption that information word column groups corresponding to an (i+1)-th column group to an $(N_2-K_2)/M_2-1$-th column group are not present for the parity check matrix $H_2$ to be designed.)

<Condition 1>: $S_{i,0}^{(k)} \in B_i^{(k)}$ (k=0, 1, 2, ..., $D_i$−1)

<Condition 2>: a sequence in which a value of a girth on a Tanner graph is maximum and the number of cycles having a corresponding girth is minimum among sequences satisfying <Condition 1>. Here, the girth means a length of the shortest cycle among cycles present on the Tanner graph. However, when the best cases are several, one of them is arbitrarily selected.

Step 5) processes of Step 3 and Step 4 are continuously repeated for i 1, 2, ..., $(N_2-K_2)/M_2-1$.

Step 6) a finally selected sequence $S_{i,0}^{(k)}$ (i=0, 1, ..., $K_{ldpc}/M-1$, k=0, 1, 2, ..., $D_i$−1) is determined to be a sequence indicating a column group corresponding to an information word bit of $H_2$.

When the lifting method as described above is used, it may become relatively simple to design a parity check matrix configured of $N_{ldpc}$ columns and $N_{ldpc}-K_{ldpc}$ rows and including a parity portion having the same structure as that of the parity check matrix 300 of FIG. 3 from a mother parity check matrix configured of $N_{ldpc}/M$ columns and $(N_{ldpc}-K_{ldpc})/M$ rows and including a parity portion having the same structure as that of the parity check matrix 300 of FIG. 3

When a parity check matrix is to be designed by applying the lifting for the given mother parity check matrix once, since the numbers of columns and rows of the mother matrix are 1/M of the size of the parity check matrix that is to be finally designed, respectively, a total number of selections of the respective figures $S_{i,0}^{(k)}$ configuring a sequence that is to be found in the lifting process is M. As described above, when the M selections for all of the respective figures indicating the column group corresponding to the information word bit are present, a design is not easy due to an excessive many number when M is relatively large.

However, in the case in which a parity check matrix is designed by applying the lifting in several steps for the given mother matrix, the parity check matrix may be more easily designed. For example, when the mother parity check matrix is $H_1$ and the parity check matrix that is to be finally designed is H, assume that the lifting was designed through w steps such as $H_1 \to H_2 \to \ldots H_w \to H$.

Here, when a size of the column group configuring each parity check matrix $H_i$ is $M_i$, it may be appreciated that the following relationship: $M_2=A_1 \times M_1, M_3=A_2 \times M_2, \ldots, M_w = A_{(w-1)} \times M_{(w-1)}, M = A_w \times M_w$ is satisfied by the assumption of the lifting process. Here, $A_i$ is a positive integer larger than 1 (i=1, 2, ..., w). In addition, when the above Equation is arranged, it may be easily confirmed that $M=M_1 \times A_1 \times A_2 \times \ldots \times A_w$.

In summary, since the number of selections of the respective figures of a sequence indicating the column group of the information word bit in each i-th lifting process is $A_i$, it may be appreciated that when the lifting is applied w times in order to design H from $H_1$, a total number of selections is $(A_1+A_2+\ldots+A_w)$. This is significantly decreased as compared with the M selections, that is, $A_1 \times A_2 \times \ldots \times A_w$ selections when the lifting is applied only once. It may be appreciated that the more the lifting applying steps, the more efficient.

However, in the case in which excessively many lifting steps are applied, the number of selections is excessively decreased, such that it is difficult to find a sequence of column groups having good cycle characteristics. Therefore, the lifting steps may be appropriately selected depending on a code that is to be designed.

As an example of a design result by the above-mentioned method, in the case in which a length $N_{ldpc}$ of the codeword is 16200, a code rate is 7/15, and M is 360 (or $Q_{ldpc}$=24), indices of rows at which one (1) is positioned in the zero (0)-th column of the i-th column group of the parity check matrix having the structure of FIG. 3 are shown by following Table 2.

TABLE 1

| i | Indices of rows at which 1s are positioned in 0-th column of i-th column group |
|---|---|
| 0 | 235 1639 1674 1780 1834 2149 2365 2402 2852 2923 3560 3782 3841 4710 4764 4798 5313 6568 6624 7451 7773 8007 8379 8519 |
| 1 | 446 837 968 975 1005 1747 1986 2026 2908 2982 3099 3780 4097 4513 5577 6290 6637 7159 7796 8016 8093 8104 8363 8567 |
| 2 | 360 491 1264 1685 1734 1890 2479 3897 4102 4653 4660 4849 5570 6531 6551 6667 6831 7160 7286 7525 7860 7918 8170 8321 |
| 3 | 188 344 950 997 1152 2766 3442 3819 3863 4425 5105 5258 5401 5514 5662 5703 5877 6496 6604 6851 7020 7327 8203 8621 |
| 4 | 1373 2412 6145 7700 |
| 5 | 1909 5421 7470 7530 |
| 6 | 3849 6939 7409 8503 |
| 7 | 1730 3575 6280 8572 |
| 8 | 876 1090 4430 8834 |
| 9 | 1223 2971 3776 4993 |
| 10 | 1772 2799 3336 3555 |
| 11 | 2782 3442 3569 4251 |
| 12 | 437 2465 3203 |
| 13 | 1992 6512 8466 |
| 14 | 4563 5635 6206 |
| 15 | 1719 2974 6991 |
| 16 | 3573 4212 5834 |
| 17 | 2991 7153 7282 |
| 18 | 1391 3451 5585 |
| 19 | 584 5612 7552 |
| 20 | 220 558 8121 |

As another example, in the case in which a length $N_{ldpc}$ of the codeword is 16200, a code rate is 9/15, and M is 360 (or $Q_{ldpc}$=18), indices of rows at which one (1) is positioned in the zero (0)-th column of the i-th column group of the parity check matrix having the structure of FIG. 3 are shown by following Table 3.

TABLE 3

| i | Indices of rows at which 1s are positioned in 0-th column of i-th column group |
|---|---|
| 0 | 5 144 500 526 928 1110 2279 3336 3673 4045 4148 4175 4372 4815 4953 5557 5960 6181 |
| 1 | 453 835 1010 2422 2827 2879 2912 3017 3670 3713 3933 3936 4119 4747 4758 5948 6174 6340 |
| 2 | 368 725 775 1050 1215 1281 1414 1665 2218 3746 3975 4259 4517 4777 4873 4878 5432 5506 |
| 3 | 10 563 716 934 951 1555 1866 1970 2379 2454 2614 3073 3467 3491 4680 5924 5931 6049 |
| 4 | 317 415 501 1188 1705 2036 2140 2926 2964 3624 3693 3914 4111 4864 5337 5723 6810 6179 |
| 5 | 3 332 499 525 698 1387 1398 1642 1951 2411 2594 2656 2741 2934 3143 3363 5640 5650 |
| 6 | 533 2108 5649 |
| 7 | 2664 5143 5821 |
| 8 | 2195 3155 5644 |
| 9 | 57 4454 4733 |
| 10 | 1958 5023 6255 |
| 12 | 400 2930 3215 |
| 12 | 1302 5307 6353 |
| 13 | 2748 3735 4074 |
| 14 | 3598 4144 5433 |
| 15 | 641 1592 4537 |
| 16 | 1661 3847 5024 |
| 17 | 2862 3249 5667 |
| 18 | 1992 2685 3358 |
| 19 | 426 4768 6391 |
| 20 | 2636 4540 5559 |
| 21 | 1288 4616 5550 |
| 22 | 3913 5042 5517 |
| 23 | 13 2656 4087 |
| 24 | 356 1344 5870 |
| 25 | 5729 6172 6300 |
| 26 | 1816 3361 6177 |

As still another example, in the case in which a length $N_{ldpc}$ of the codeword is 16200, a code rate is 11/15, and M is 360 (or $Q_{ldpc}=12$), indices of rows at which one (1) is positioned in the zero (0)-th column of the i-th column group of the parity check matrix having the structure of FIG. 3 are shown by following Table 4.

TABLE 4

| i | Indices of rows at which 1s are positioned in 0-th column of i-th column group |
|---|---|
| 0 | 411 499 536 726 1094 1341 1499 2053 2314 2753 3340 4245 |
| 1 | 333 582 638 1907 2392 2964 3034 3397 3735 4013 4148 4159 |
| 2 | 258 419 1308 1312 2331 3091 3104 3266 3437 3637 3837 3922 |
| 3 | 40 379 531 764 969 1634 2473 3384 3449 3982 4170 4295 |
| 4 | 66 316 319 350 365 1750 2325 2696 3061 3231 3492 3887 |
| 5 | 83 158 1300 1971 2191 2898 2904 3106 3509 3596 3633 4165 |
| 6 | 54 131 595 2120 2320 2833 3021 3039 3142 3900 4154 4241 |
| 7 | 218 1601 3167 |
| 8 | 868 1477 4004 |
| 9 | 859 1380 2571 |
| 10 | 1495 3429 4145 |
| 11 | 1266 2146 3026 |
| 12 | 1704 2768 3473 |
| 13 | 1732 2303 4170 |
| 14 | 1790 2168 3298 |
| 15 | 909 1451 3495 |
| 16 | 777 2490 4118 |
| 17 | 1354 2659 3700 |
| 18 | 1107 2720 4014 |
| 19 | 977 3096 3678 |
| 20 | 621 673 1832 |
| 21 | 2959 3855 3963 |
| 22 | 802 2103 3204 |
| 23 | 1730 2836 4080 |
| 24 | 1405 1931 2323 |
| 25 | 1565 1845 3127 |
| 26 | 1400 1891 2556 |
| 27 | 344 827 2937 |
| 28 | 1107 1720 2577 |
| 29 | 1871 2692 4155 |
| 30 | 2301 3576 3866 |
| 31 | 1948 3157 3766 |
| 32 | 1560 3570 4153 |

As yet still another example, in the case in which a length $N_{ldpc}$ of the codeword is 16200, a code rate is 13/15, and M is 360 (or $Q_{ldpc}=6$), indices of rows at which one (1) is positioned in the zero (0)-th column of the i-th column group of the parity check matrix having the structure of FIG. 3 are shown by following Table 5.

TABLE 5

| i | Indices of rows at which 1s are positioned in 0-th column of i-th column group |
|---|---|
| 0 | 380 671 699 745 1410 1564 |
| 1 | 173 232 849 1063 1242 1454 |
| 2 | 247 328 1778 2040 2051 2151 |
| 3 | 40 1064 1321 1392 1583 2121 |
| 4 | 139 508 999 1032 1550 2141 |
| 5 | 21 292 386 631 939 1290 |
| 6 | 510 530 679 885 1054 2093 |
| 7 | 929 998 1092 1264 1773 2119 |
| 8 | 127 299 597 1064 1782 1966 |
| 9 | 167 228 483 1159 2030 2110 |
| 10 | 44 517 797 1000 1197 1980 |
| 11 | 444 477 700 782 1303 1733 |
| 12 | 893 1305 2030 |
| 13 | 599 696 2121 |
| 14 | 58 474 865 |
| 15 | 1055 1450 1850 |
| 16 | 1099 1313 1418 |
| 17 | 860 1206 2002 |
| 18 | 1249 1346 2085 |
| 19 | 35 1384 2106 |
| 20 | 1084 1245 1933 |
| 21 | 19 974 1469 |
| 22 | 679 1230 1360 |
| 23 | 916 1083 2130 |
| 24 | 332 1536 1839 |
| 25 | 499 700 1820 |
| 26 | 1127 1332 1777 |
| 27 | 992 1785 1979 |
| 28 | 142 169 1707 |
| 29 | 971 1255 1296 |
| 30 | 149 579 1484 |
| 31 | 448 813 2034 |
| 32 | 107 909 1703 |
| 33 | 178 1322 2053 |
| 34 | 323 1428 1816 |
| 35 | 89 783 1285 |
| 36 | 1550 1881 2034 |
| 37 | 239 1492 1578 |
| 38 | 654 702 1747 |

Meanwhile, in the design process of an LDPC code, in Step 5), the lifting method in which the cycle characteristics are considered was applied. When various algebraic characteristics as well as the cycle characteristics are additionally considered, a code having better performance may be designed.

Generally, since the performance of an LDPC code has an influence on the degree distribution as well as the cycle characteristics, a code having better performance may be designed in consideration of both of these two characteristics.

In the present embodiment, a method applied to a process of determining a parameter depending on cycles having the shortest length and the number of variable nodes included in these cycles and having a specific degree and determining the sequence in Lift Step 4) depending on a rule determined through the parameter is suggested.

As an example of the present embodiment, <Condition 2> of the Lifting Step 4) is changed into <Condition 2'> and <Condition 3>.

<Condition 2'>: a sequence in which a girth is maximum for cycles satisfying the following <Condition 3> and the number of cycles having the corresponding girth value is minimum among sequences satisfying <Condition 1>.

<Condition 3>: cycles considered in the case in which the lifting process is applied to column groups having degrees of A and B are as follows:

cycles in which the number of variable nodes having a degree of A among variable nodes included in the cycles in a process of performing lifting of a column group having a degree of A is $x_1$ or less, and cycles in which a value of (the number of variable nodes having a degree of A+the number of variable nodes having a degree of B×C) for variable nodes included in the cycles in a process of performing lifting of a column group having a degree of B is $x_2$ or less.

However, all cycles are considered in the case in which the lifting process is applied to column groups of which degrees are not A and B.

Here, A is a positive integer of two (2) or more, B is a positive integer larger than A and smaller than a maximum degree of the parity check matrix, and C, which is a weighting factor, has a positive integer value.

In addition, all cycles are considered without distinction of a specific cycle in the case in which the lifting process is applied to the column groups of which degrees are not A and B.

As a specific example, the case in which A=3, B=4, and C=2 will be described.

For example, in the lifting process, the lifting is performed in consideration of only cycles in which the number of variable nodes (which is the same as that of columns) having a degree of three (3) among variable nodes included in the cycles in a process of performing the lifting of column groups having a degree of three (3) is $x_1$ or less and (the number of variable nodes having a degree of four (4)+the number of variable nodes having a degree of three (3)) among variable nodes included in the cycles in a process of performing the lifting of column groups having a degree of four (4) is $x_2$ or less.

Generally, in simple lifting, the parity check matrix is designed such that the number of cycles is decreased. In this process, the parity check matrix is designed such that the number of cycles satisfying the above-mentioned conditions is decreased.

The reason why the above-mentioned conditions have an influence on designing the LDPC code having a better performance is that the cycles and the degree distribution, which have an influence on the LDPC code, have been considered in the above-mentioned conditions.

Examples of an LDPC code designed in consideration of these additional conditions are shown in following Tables 6 to 15.

For reference, $(x_1, x_2)$ considered in Table 6 is (4, 5), $(x_1, x_2)$ considered in Table 7 is (4, 5), $(x_1, x_2)$ considered in Table 8 is (3, 4), and $(x_1, x_2)$ considered in Table 9 is (3, 4).

In addition, $(x_1, x_2)$ considered in Table 10 is (5, 5), $(x_1, x_2)$ considered in each of Tables 11 to 13 is (4, 4), and $(x_1, x_2)$ considered in each of Tables 14 and 15 is (3, 4).

Referring to Tables 6 to 15, it may be appreciated that different LDPC codes may be designed for the same $x_1$ and $x_2$ values. It is to be noted that the reason is that a plurality of selections are possible in selecting the sequence in the lifting process.

As an example of a design result in consideration of the additional conditions as described above, in the case in which a length $N_{ldpc}$ of the codeword is 16200, a code rate is 7/15, and M is 360 (or $Q_{ldpc}$=24), indices of rows at which one (1) is positioned in the zero (0)-th column of the i-th column group of the parity check matrix having the structure of FIG. 3 are shown by following Table 6.

TABLE 6

| i | Indices of rows at which 1s are positioned in 0-th column of i-th column group |
|---|---|
| 0 | 432 699 893 942 1285 1427 1738 2199 2441 2565 2932 3201 4144 4419 4678 4963 5423 5922 6433 6564 6656 7478 7514 7892 |
| 1 | 220 453 690 826 1116 3425 1488 1901 3119 3182 3568 3800 3953 4071 4782 5038 5555 6836 6871 7131 7609 7850 8317 8443 |
| 2 | 300 454 497 930 1757 2145 2314 2372 2467 2319 3191 3256 3699 3984 4538 4965 5461 5742 5912 6135 6649 7636 8078 8455 |
| 3 | 24 65 565 609 990 1319 1394 1465 1918 1976 2463 2987 3330 3677 4195 4240 4947 5372 6453 6950 7058 8412 8500 8599 |
| 4 | 1373 4668 5324 7777 |
| 5 | 189 3930 5766 6877 |
| 6 | 3 2961 4207 5747 |
| 7 | 1108 4768 6743 7106 |
| 8 | 1282 2274 2750 6204 |
| 9 | 2279 2587 2737 6344 |
| 10 | 2889 3164 7275 8040 |
| 11 | 133 2734 5081 8386 |
| 12 | 437 3203 7121 |
| 13 | 4280 7128 8490 |
| 14 | 619 4563 6206 |
| 15 | 2799 6814 6991 |
| 16 | 244 4232 5925 |
| 17 | 1719 7657 8554 |
| 18 | 53 2895 6685 |
| 19 | 584 5420 6856 |
| 20 | 2958 5834 8103 |

As another example of the design result in consideration of the additional conditions, in the case in which a length $N_{ldpc}$ of the codeword is 16200, a code rate is 9/15, and M is 360 (or $Q_{ldpc}$=18), indices of rows at which one (1) is positioned in the zero (0)-th column of the i-th column group of the parity check matrix having the structure of FIG. 3 are shown by following Table 7.

TABLE 7

| i | Indices of rows at which 1s are positioned in 0-th column of i-th column group |
|---|---|
| 0 | 692 1041 1719 1963 2149 2318 2562 2740 2821 3358 3581 4188 4412 3033 5058 6033 6161 6478 |
| 1 | 85 158 231 454 942 981 1569 1762 1848 3152 3286 4691 5119 6351 5885 5905 6254 6281 |
| 2 | 44 111 626 857 1244 1381 1401 1912 2694 2934 1178 3627 3679 3941 4469 5128 5406 6373 |
| 3 | 230 646 1245 1848 1889 2111 2179 2583 2756 2988 3589 4353 4688 4744 5712 5908 5935 6329 |
| 4 | 102 845 1103 1471 1788 1883 1928 2311 2898 2967 3112 3483 3806 4712 5041 5176 5349 5674 |
| 5 | 118 263 1040 1835 2259 2472 3104 6760 3837 3869 3906 2843 4119 5081 5119 5222 5332 5520 |
| 6 | 533 2108 5631 |
| 7 | 2264 5557 5821 |
| 8 | 1421 3155 5644 |

TABLE 7-continued

| i | Indices of rows at which 1s are positioned in 0-th column of i-th column group |
|---|---|
| 9 | 57 305 4454 |
| 10 | 302 5023 6255 |
| 11 | 400 986 3215 |
| 12 | 1302 1979 6243 |
| 13 | 3735 4074 4998 |
| 14 | 4144 4354 6433 |
| 15 | 541 1592 2773 |
| 16 | 481 1661 5024 |
| 17 | 2862 3249 3667 |
| 18 | 2280 2685 6022 |
| 19 | 426 4768 6391 |
| 20 | 969 7636 4540 |
| 21 | 1288 4616 5550 |
| 22 | 3913 5042 5517 |
| 23 | 13 2656 4087 |
| 24 | 356 3306 5870 |
| 25 | 448 5729 6300 |
| 26 | 517 1816 6177 |

As still another example of the design result in consideration of the additional conditions, in the case in which a length $N_{ldpc}$ of the codeword is 16200, a code rate is 11/15, and M is 360 (or $Q_{ldpc}$=12), indices of rows at which one (1) is positioned in the zero (0)-th column of the i-th column group of the parity check matrix having the structure of FIG. 3 are shown by following Table 8.

TABLE 8

| i | Indices of rows at which 1s are positioned in 0-th column of i-th column group |
|---|---|
| 0 | 191 507 750 1494 1713 1915 2438 2609 2928 3145 3392 3442 |
| 1 | 293 1177 1544 2563 2266 2508 2894 3286 4462 3703 3940 4223 |
| 2 | 530 708 822 3185 1282 1420 1715 2331 2715 2909 3776 3913 |
| 3 | 1168 1391 1424 1501 1557 1966 2227 2310 2940 3134 3219 4217 |
| 4 | 90 140 366 1393 1848 2251 2769 2931 3125 1383 3968 3994 |
| 5 | 378 559 822 1813 2224 2999 2734 3069 3324 3500 3551 4084 |
| 6 | 240 777 1022 1216 2303 2338 2581 2909 3183 3836 4038 4171 |
| 7 | 218 1601 2327 |
| 8 | 584 1204 1477 |
| 9 | 1380 2035 2571 |
| 10 | 1495 3429 4145 |
| 11 | 1878 2194 3025 |
| 12 | 1565 1704 2768 |
| 13 | 508 1643 4170 |
| 14 | 1790 2350 2672 |
| 15 | 791 3297 3495 |
| 16 | 777 2490 4118 |
| 17 | 358 643 1828 |
| 18 | 1107 2768 4014 |
| 19 | 137 1242 3096 |
| 20 | 621 673 1812 |
| 21 | 2609 3855 3961 |
| 22 | 2103 4150 4308 |
| 23 | 1514 2776 4080 |
| 24 | 1405 2323 2819 |
| 25 | 118 2177 3127 |
| 26 | 1400 1891 2558 |
| 27 | 344 1115 2937 |
| 28 | 1107 1720 2577 |
| 29 | 359 2944 4166 |
| 30 | 2301 3575 3866 |
| 31 | 40 1366 3157 |
| 32 | 1560 2574 4153 |

As yet still another example of the design result in consideration of the additional conditions, in the case in which $N_{ldpc}$ is 16200, a code rate is 13/15, and M is 360 (or $Q_{ldpc}$=6), indices of rows at which one (1) is positioned in the zero (0)-th column of the i-th column group of the parity check matrix having the structure of FIG. 3 are shown by the following Table 9.

TABLE 9

| i | Indices of rows at which 1s are positioned in 0-th column of i-th column group |
|---|---|
| 0 | 812 1005 1572 1691 2092 2113 |
| 1 | 445 488 576 839 1059 1210 |
| 2 | 166 199 657 1269 1350 1712 |
| 3 | 162 771 820 1225 1412 1715 |
| 4 | 224 287 760 1071 1087 1194 |
| 5 | 64 243 1052 1335 1475 2130 |
| 6 | 44 267 307 1433 1632 1774 |
| 7 | 317 1255 1390 1437 1884 1946 |
| 8 | 716 774 808 1033 1505 1761 |
| 9 | 367 402 509 777 1454 1966 |
| 10 | 43 281 354 1142 1240 2043 |
| 11 | 65 352 570 705 751 955 |
| 12 | 893 903 1082 |
| 13 | 599 1200 2121 |
| 14 | 474 646 1729 |
| 15 | 1055 1408 1850 |
| 16 | 61 113 1418 |
| 17 | 730 1206 2138 |
| 18 | 811 1346 2085 |
| 19 | 35 1384 2106 |
| 20 | 1084 1245 1933 |
| 21 | 25 974 1469 |
| 22 | 769 988 1230 |
| 23 | 358 1341 2130 |
| 24 | 894 1568 1839 |
| 25 | 268 499 1820 |
| 26 | 811 1127 1332 |
| 27 | 908 1575 1979 |
| 28 | 142 169 1707 |
| 29 | 1255 1298 2003 |
| 30 | 149 440 529 |
| 31 | 448 813 2034 |
| 32 | 107 1353 1700 |
| 33 | 178 1322 2053 |
| 34 | 323 976 1428 |
| 35 | 89 783 1285 |
| 36 | 1550 1881 2034 |
| 37 | 239 1578 1594 |
| 38 | 702 1747 1828 |

As yet still another example of the design result in consideration of the additional conditions, in the case in which $N_{ldpc}$ is 16200, a code rate is 5/15, and M is 360 (or $Q_{ldpc}$=30), indices of rows at which one (1) is positioned in the zero (0)-th column of the i-th column group of the parity check matrix having the structure of FIG. 3 are shown by following Table 10.

TABLE 10

| i | Indices of rows at which 1s are positioned in 0-th column of i-th column group |
|---|---|
| 0 | 245 449 491 980 1084 1194 1277 1671 2026 3185 4399 4900 5283 5413 5558 6370 7492 7768 7867 7984 8306 8483 8636 9357 9642 10045 10179 10261 10338 10412 |
| 1 | 1318 1584 1682 1880 1954 2000 2062 3387 3441 1879 3931 4240 4302 4445 4503 5117 5588 5675 5793 3955 6097 5221 6449 6615 7218 7394 9535 9896 10009 10763 |
| 2 | 105 472 785 911 1168 1450 2550 2832 3277 3624 4128 4460 4372 4669 4783 5102 5133 5199 5905 6647 7028 7086 7703 8121 8217 9149 9304 9475 9736 9384 |
| 3 | 1217 9338 9737 8334 |
| 4 | 855 894 2979 9443 |
| 5 | 7506 7811 9232 9982 |
| 6 | 848 3313 3880 3990 |
| 7 | 2095 4112 4620 9946 |
| 8 | 1400 2396 6130 7483 |
| 9 | 1002 2241 7067 10418 |
| 10 | 2008 3299 7215 7502 |
| 11 | 1161 7705 8194 8534 |
| 12 | 2316 4803 8849 9359 |
| 13 | 125 1860 3277 |
| 14 | 1141 8033 9072 |

As yet still another example of the design result in consideration of the additional conditions, in the case in which $N_{ldpc}$ is 16200, a code rate is 9/15, and M is 360 (or $Q_{ldpc}$=18), indices of rows at which one (1) is positioned in the zero (0)-th column of the i-th column group of the parity check matrix having the structure of FIG. 3 are shown by following Tables 11 and 12.

TABLE 11

| i | Indices of rows at which 1s are positioned in 0-th column of i-th column group |
|---|---|
| 0 | 350 462 1291 1383 3821 2239 2493 3328 3353 3772 3872 3923 4259 4426 4542 4972 5347 6217 6246 6332 6386 |
| 1 | 177 869 1214 1253 1398 1482 1737 2014 2161 2331 3108 3297 3438 4388 4480 4456 4522 4783 5273 6037 6395 |
| 2 | 347 501 658 966 1622 1659 1934 2117 2527 3158 3231 3379 3427 3739 4218 4497 4894 5000 5167 5728 5975 |
| 3 | 319 398 599 1143 1796 3198 3521 3686 4139 4453 4556 4636 4688 4753 4986 5199 5224 5496 5698 5724 6123 |
| 4 | 162 257 304 574 945 1695 1855 2527 2780 2902 2958 3439 3484 4224 4759 4928 5156 5303 5971 6158 6477 |
| 5 | 807 1699 2941 4276 |
| 6 | 2652 2857 4680 5358 |
| 7 | 329 2100 2512 3632 |
| 8 | 1151 1231 3872 4869 |
| 9 | 1561 3365 5338 5303 |
| 10 | 407 794 1455 |
| 11 | 3438 5683 5749 |
| 12 | 1504 1985 3563 |
| 13 | 440 5021 6321 |
| 14 | 184 3645 5923 |
| 15 | 1217 1462 6422 |
| 16 | 1212 4715 5973 |
| 17 | 4098 5100 5642 |
| 18 | 5512 5857 6226 |
| 19 | 2583 5506 5933 |
| 20 | 784 1801 4890 |
| 21 | 4734 4779 4875 |
| 22 | 933 5081 5377 |
| 23 | 127 4125 4704 |
| 24 | 1244 2178 3352 |
| 25 | 3659 6360 6465 |
| 26 | 1686 3464 4336 |

TABLE 12

| i | Indices of rows at which 1s are positioned in 0-th column of i-th column group |
|---|---|
| 0 | 366 662 741 1053 2010 2487 2551 2627 3190 3490 3515 3590 3704 4160 4757 5041 5501 5569 5778 6004 6424 |
| 1 | 311 350 742 1058 1128 1252 1503 1667 1749 2112 2446 2671 2983 3047 3224 3504 5409 5541 5563 6272 6407 |
| 2 | 565 801 1543 1707 1739 2106 2319 2760 2969 3155 3225 3270 3362 4382 4435 4844 5020 5053 6040 6304 6349 |
| 3 | 79 170 200 1240 1336 1580 1812 2117 2337 2361 2422 2458 3083 4045 4446 4700 4938 5383 6047 6075 6138 |
| 4 | 135 678 797 1312 1801 2431 2461 3032 3350 3383 3654 3820 3881 3921 4164 5007 5248 5336 5612 5747 5857 |
| 5 | 1951 3088 3783 6153 |
| 6 | 798 5278 6046 6259 |
| 7 | 426 815 2552 5670 |
| 8 | 161 3818 5109 5353 |
| 9 | 1183 4151 4742 5815 |
| 10 | 74 2607 3791 |
| 11 | 18 3949 4297 |
| 12 | 359 3191 4798 |
| 13 | 1097 1340 4737 |
| 14 | 1485 5239 6170 |
| 15 | 1264 5447 5594 |
| 16 | 2011 5766 5831 |
| 17 | 102 1050 3320 |
| 18 | 1168 7573 5548 |
| 19 | 1413 2122 4295 |

TABLE 12-continued

| i | Indices of rows at which 1s are positioned in 0-th column of i-th column group |
|---|---|
| 20 | 1722 3835 3862 |
| 21 | 2007 2088 6189 |
| 22 | 254 805 3443 |
| 23 | 2629 3174 4413 |
| 24 | 1300 3924 4790 |
| 25 | 3351 5216 5441 |
| 26 | 1970 2392 3198 |

As yet still another example of the design result in consideration of the additional conditions, in the case in which $N_{ldpc}$ is 16200, a code rate is 11/15, and M is 360 (or $Q_{ldpc}$=12), indices of rows at which one (1) is positioned in the zero (0)-th column of the i-th column group of the parity check matrix having the structure of FIG. 3 are shown by following Table 13.

TABLE 13

| i | Indices of rows at which 1s are positioned in 0-th column of i-th column group |
|---|---|
| 0 | 108 297 703 742 1345 1443 1495 1528 1812 2341 2559 2669 2810 2877 3442 3690 3755 3904 4264 |
| 1 | 180 211 477 788 824 1090 1272 1578 1685 1948 2050 2195 2233 2546 2757 2946 3147 3299 3544 |
| 2 | 627 741 1135 1157 1225 1333 1378 1427 1454 1696 1757 1772 2099 2208 2592 3354 3580 4066 4742 |
| 3 | 9 795 959 989 1006 1032 1135 1209 1382 1484 1703 1855 1985 2043 2629 2845 3136 3450 3742 |
| 4 | 230 413 801 829 1108 1170 1291 1759 1793 1827 1976 2000 2423 2466 2917 3010 3600 3782 4143 |
| 5 | 56 142 236 381 1050 1141 1372 1627 1985 2247 2340 3023 3434 3519 3957 4013 4142 4164 4279 |
| 6 | 298 1211 2548 3643 |
| 7 | 73 1070 1614 1748 |
| 8 | 1439 2141 3614 |
| 9 | 284 1564 2629 |
| 10 | 607 660 855 |
| 11 | 1195 2037 2753 |
| 12 | 49 1198 2562 |
| 13 | 296 1145 3540 |
| 14 | 1516 2315 2382 |
| 15 | 154 722 4016 |
| 16 | 759 2375 3825 |
| 17 | 162 194 1749 |
| 18 | 2335 2422 2632 |
| 19 | 6 1172 2583 |
| 20 | 226 1325 2428 |
| 21 | 585 2708 2769 |
| 22 | 255 2801 3181 |
| 23 | 2979 3720 4090 |
| 24 | 208 1428 4094 |
| 25 | 199 3743 3757 |
| 26 | 1229 2059 4282 |
| 27 | 458 1100 1387 |
| 28 | 1199 2481 3284 |
| 29 | 1161 1467 4060 |
| 30 | 959 3014 4144 |
| 31 | 2556 3960 4125 |
| 32 | 2809 3834 4318 |

As yet still another example of the design result in consideration of the additional conditions, in the case in which $N_{ldpc}$ is 16200, a code rate is 13/15, and M is 360 (or $Q_{ldpc}$=6), indices of rows at which one (1) is positioned in the zero (0)-th column of the i-th column group of the parity check matrix having the structure of FIG. 3 are shown by following Tables 14 and 15.

TABLE 14

Indices of rows at which 1s are positioned in
i   0-th column of i-th column group 0  37 144 151 199 220 498 510 589 731 808 955 1249 1264 1311 1377 1460 1520 1598 1707 1958 2055 2099 2154
1  20 27 165 462 546 583 742 795 1095 1110 1129 1145 1159 1190 1254 1363 1383 1459 1718 1835 1870 1879 2108 2128
2  288 362 463 505 688 691 745 861 1006 1083 1124 1175 1247 1275 1337 1353 1378 1506 1588 1632 1720 1868 1980 2135
3  405 464 478 511 566 574 641 766 785 802 836 996 1128 1239 1247 1449 1491 1537 1616 1643 1668 1950 1975 2149
4  86 192 245 357 363 374 700 713 852 903 992 1174 1245 1277 1342 1369 1381 1417 1463 1712 1900 1952 2053 2118
5  101 327 378 550
6  186 723 1318 1550
7  118 277 504 1835
8  199 407 1776 1965
9  187 1253 1328 1975
10 62 144 1163 2017
11 100 475 572 2136
12 431 865 1568 2055
13 783 640 981 1172
14 220 1038 1903 2147
15 483 1318 1358 2118
16 92 961 1709 1810
17 112 403 1485 2042
18 431 1110 1130 1365
19 587 1008 1206 1588
20 704 1113 1943
21 375 1487 2100
22 1507 1950 2110
23 962 1611 2038
24 554 1295 1501
25 488 784 1446
26 871 1935 1964
27 54 1475 1504
28 1579 1617 2074
29 1856 1967 2131
30 330 1582 2107
31 40 1056 1809
32 1110 1353 1410
33 232 554 1939
34 168 641 1099
35 333 437 1556
36 153 522 745
37 719 931 1188
38 237 638 1607

TABLE 15

Indices of rows at which 1s are positioned in
i   0-th column of i-th column group 0  35 738 817 922 1007 1039 1076 1192 1219 1286 1425 1614 1751 1806 1876 2007 2042 2091
1  23 322 489 566 637 772 811 876 1074 1253 1323 1554 1583 1675 1766 1977 1996 2018
2  215 232 351 358 527 571 782 954 994 1286 1308 1449 1455 1471 1837 1985 2094 2102
3  79 157 251 312 399 533 568 592 698 828 1060 1070 1305 1524 1893 2011 2060 2141
4  45 121 330 500 520 805 863 915 938 994 1031 1050 1269 1559 1604 1692 1895 1957
5  343 396 563 691 803 892 899 1146 1272 1294 1341 1389 1543 1636 1688 1748 1884 1941
6  45 172 231 242 357 403 413 503 571 713 728 1094 1218 1309 1470 1538 1876 2028
7  429 1010 1769
8  573 1236 1919
9  1327 1540 1686
10 344 1198 2051
11 293 1819 1850
12 204 1450 1892
13 278 1509 1603
14 214 702 1421
15 343 1846 1971
16 560 1195 1757

TABLE 15-continued

Indices of rows at which 1s are positioned in
i   0-th column of i-th column group 17 1195 2092 2130
18 520 807 1158
19 144 626 1155
20 1724 1834 2101
21 721 1218 2045
22 785 974 2051
23 447 778 1837
24 1429 1602 2123
25 1751 1971 2084
26 90 633 790
27 393 731 758
28 753 1082 1270
29 1048 1366 1722
30 123 1607 1711
31 50 1383 1656
32 886 930 1403
33 504 521 1651
34 1022 1507 1833
35 778 1326 1844
36 327 415 1088
37 981 1342 1411
38 155 1266 1372

Here, it is to be noted that even if a parity-check matrix is changed such that orders of indices within sequences of each i-th column group in Tables 2 to 15 are changed, the changed parity-check matrix is a parity check matrix of the same code.

For example, a sequence corresponding to a zero (0)-th column group in Table 5 is arranged in an order of 380, 671, 699, 745, 1410, 1564. Even if an arranging order of this sequence is changed into 671, 699, 1410, 380, 1564, 745, it is a parity check matrix of the same code.

In addition, even if arranging orders of sequences of respective column groups in Tables 2 to 15 are changed, algebraic characteristics such as cycle characteristics, degree distribution, a minimum distance, and the like, on a graph of a code are not changed. Therefore, the case in which arranging orders of sequences shown in Tables 2 to 15 are changed may become one example of a result that may be derived through a code design method suggested in the present embodiment.

For example, even if arranging orders of the sequence 380, 671, 699, 745, 1410, 1564 of a zero (0)-th column group in Table 5 and a sequence 893, 1305, 2030 of a twelfth column group in Table 5 are changed to set the sequence of the zero (0)-th column group to 893, 1305, 2030 and set the sequence of the twelfth column group to 380, 671, 699, 745, 1410, 1564, cycle characteristics, degree distribution, a minimum distance, and the like, on a graph of the code are not changed (actually, since changing arranging orders of sequences of the respective column groups are the same as changing arranging orders of column groups within a parity check matrix, main algebraic characteristics are not changed).

In addition, a result of adding an integer multiple of $Q_{ldpc}$ to all of the sequences of any column groups in Tables 2 to 15 may also become one example of a result that may be derived through the code design method suggested in the present embodiment since the algebraic characteristics such as the cycle characteristics, the degree distribution, or the like, on the graph of the code are not changed.

For example, as a result of adding a multiple of 6 to all indices 893, 1305, 2030 of the twelfth column group in Table 5 for $Q_{ldpc}=N_{ldpc}-K_{ldpc})/M=6$, also in the case of 899 (=893+6), 1311 (=1305+6), 2036 (=2030+6) or 911 (=893+6×3), 1323 (=1305+6×3), 2048 (=2030+6×3) as a specific example, the algebraic characteristics such as the cycle characteristics, the degree distribution, the minimum distance, or the like, on the graph of the code are not changed (actually, since a sequence obtained as a result of adding a multiple of $Q_{ldpc}$ to any sequence is a sequence in which only an order of columns present within a corresponding column group is rearranged, main algebraic characteristics are not changed).

Here, it is to be noted that in the case in which a value obtained by adding the multiple of $Q_{ldpc}$ to a given sequence is a value of ($N_{ldpc}-K_{ldpc}$) or more, it is changed into a value obtained by applying a modulo operation for ($N_{ldpc}-K_{ldpc}$) to the value. For example, when 6×3 is added to all of a sequence 247, 328, 1778, 2040, 2051, 2151 of a second column group in Table 5, a sequence 265, 346, 1796, 2058, 2069, 2169 is resultantly generated. In this case, since ($N_{ldpc}-K_{ldpc}$)=2160, modulo-2160 is applied to the sequence, thereby making it possible to represent the sequence as 265, 346, 1796, 2058, 2069, 9 or 9, 265, 346, 1796, 2058, 2069.

In addition, although the sequences are represented based on the structure of the parity check matrix of FIG. 3 in Tables 2 to 15, in the case of applying row permutation for rearranging an order of rows, column permutation for rearranging an order of columns, or the like, to the parity check matrix of FIG. 3, the parity check matrix may be represented in a form different from the structure of FIG. 3. However, since an operation such as the row permutation, the column permutation, and the like, does not change the algebraic characteristics of the LDPC code itself such as the cycle characteristics, the degree distribution, the minimum distance, or the like, the parity check matrices may be considered to be the same as each other.

That is, when any given parity check matrix may be changed into a parity check matrix having the structure as shown in FIG. 3 through appropriate row permutation and column permutation and the case in which sequences coincide with one another in Tables 2 to 15 when the changed parity check matrix is represented like the sequences represented in Tables 2 to 15 is present, it is decided that two parity check matrices are algebraically equivalent to each other.

Hereinafter, a process of encoding an LDPC code using a parity check matrix having the structure as shown in FIG. 3 will be described. As described above, the process of encoding an LDPC code is to determine a codeword satisfying a relational equation: parity check matrix×codeword=0. That is, the LDPC encoding process may be represented by $H \cdot C^T = 0$. Here, H is a parity check matrix, and C is a LDPC codeword.

Hereinafter, when it is assumed that LDPC encoded information word bits are ($i_0, i_1, \ldots, i_{K_{ldpc}-1}$) and LDPC codeword its generated by LDPC encoding are ($c_0, c_1, \ldots, c_{N_{ldpc}-1}$), a method for calculating LDPC codeword bits will be described.

First, since the LDPC code is a systematic code, $c_k (0 \leq k \leq K_{ldpc}-1)$ is set to be the same as $i_k$. In addition, remaining codeword bits are set to $p_k := c_{k+K_{ldpc}}$. Here, $p_k$ indicates parity bits and may be calculated as described below.

Meanwhile, since the parity check matrix is defined as in Tables 2 to 15 according to an exemplary embodiment, a process to be described below may be applied in the case in which the parity check matrix is defined as in Tables 2 to 15.

First, when it is assumed that an entry denoted in a j-th position of an i-th row in Tables 2 to 15 is q (i, j, 0), q (i, j, 1)=q (i, j, 0)+$Q_{ldpc}$·1 (mod $N_{ldpc}-K_{ldpc}$) for 0<l<360. Here, accumulation '+' means additions defined in a Galois field (GF) (2) (that is, additions in GF(2)). In addition, $Q_{ldpc}$, which is a magnitude at which each column is cyclically shifted in an information word sub-matrix, may be a value defined in each of Tables 2 to 15.

Meanwhile, when q (i, j, 0) and q (i, j, 1) are defined as described above, a process of calculating parity bits is as follows.

Step 1) parity bits are initialized to '0'. That is, $p_k=0$ for $0 \leq k \leq N_{ldpc}-K_{ldpc}$ Step 2) i and 1 are set so that i:=$\lfloor k/360 \rfloor$ and 1:=k (mod 360) for all k values of $0 \leq k < K_{ldpc}$. Here, $\lfloor x \rfloor$ is the largest integer value among integers that are not larger than x. That is, $\lfloor 1.2 \rfloor = 1$. Then, $i_k$ is added to $p_{q(i,j,1)}$ for all js as follows based on the set i and j values. That is, $p_{q(i, 0, 1)} = p_{q(i, 0, 1)} + i_k$, $p_{q(i, 1, 1)} = p_{q(i, 1, 1)} + i_k$, $p_{q(i, 2, 1)} = p_{q(i, 2, 1)} + i_k$, ..., $p_{q(i, w(i)-1, 1)} = p_{q(i, w(i)-1, 1)} + i_k$ are calculated.

Here, w(i) is the number of values of the i-th row in Tables 2 to 15 and means the number of ones (1s) of a column corresponding to $i_k$ in the parity check matrix. That is, w(i) means the number of ones (1s) of the column corresponding to $i_k$ in the parity check matrix. In addition, q (i, j, 0), which is an entry denoted in a j-th position of an i-th row in Tables 2 to 15, is an index of the parity bit, and indicates a position of a row at which one (1) is present in a column corresponding to $i_k$ in the parity check matrix.

Step 3) $p_k = p_k + p_{k-1}$ is calculated for all ks satisfying $0 < k < N_{ldpc}-K_{ldpc}$ to calculate the parity bit $p_k$.

The parity bits are calculated by the above-mentioned method. As a result, the LDPC codeword bits $c_0, c_1, \ldots, c_{N_{ldpc}-1}$ may be calculated.

Meanwhile, the LDPC encoding process as described above is only an example. Meanwhile, since the LDPC encoding is a process of calculating an LDPC codeword C satisfying $H \cdot C^T = 0$, various encoding methods may be present for the given parity check matrix.

For example, a scheme applied in a DVB-T2 standard may also be applied to the case in which the parity check matrix is defined as shown in Tables 2 to 15. Hereinafter, the LDPC encoding process depending on the scheme applied in the DVB-T2 standard will be schematically described using an example in which the parity check matrix is defined as in Table 5.

First, when it is assumed that information word bits having a length of $K_{ldpc}$ are [$i_0, i_1, i_2, \ldots, i_{K_{ldpc}-1}$] and parity bits having a length of $N_{ldpc}-K_{ldpc}$ are [$p_0, p_1, p_2, \ldots, p_{N_{ldpc}-K_{ldpc}-1}$], the LDPC encoding may be performed by the following process.

Step 1) parity bits are initialized to '0'. That is, $$p_0 = p_1 = p_2 = \cdots = p_{N_{ldpc}-K_{ldpc}-1} = 0$$

Step 2) zero (0)-th information word bits $i_0$ are accumulated in parity bits having addresses of parity bits defined in a first row (that is, a row of i=0) of Table 5 as indices of the parity bits. This may be represented by following mathematical expression 5.

$$p_{380} = p_{380} \oplus i_0$$

$$p_{671} = p_{671} \oplus i_0$$

$$p_{699} = p_{699} \oplus i_0$$

$$p_{745} = p_{745} \oplus i_0$$

$$p_{1410} = p_{1410} \oplus i_0$$

$$p_{1564} = p_{1564} \oplus i_0 \qquad (5),$$

where $i_0$ means a zero (0)-th information word bit, $p_i$ means an i-th parity bit, and $\oplus$ means a binary operation. According to the binary operation, $1 \oplus 1$ is 0, $1 \oplus 0$ is 1, $0 \oplus 1$ is 1, and $0 \oplus 0$ is 0.

Step 3) 359 remaining information word bits $i_m$ (m=1, 2, . . . , 359) are accumulated in the parity bits. Here, the remaining information word bits may be information word bits belonging to the same column group as a column group to which $i_0$ belongs. Here, an address of the parity bit may be determined based on following mathematical expression 6.

$$(x+(m \bmod 360) \times Q_{ldpc}) \bmod (N_{ldpc}-K_{ldpc}) \quad (6)$$

Here, x is an address of a parity bit accumulator corresponding to the information word bit $i_0$, and $Q_{ldpc}$, which is a size at which each column is shifted in a sub-matrix corresponding to the information word, is 6.

As a result, each of the information word bits $i_m$ (m=1, 2, . . . , 359) are accumulated in each of the parity bits having the addresses of the parity bits calculated based on above mathematical expression 6 as indices. As an example, an operation as represented by following mathematical expression 7 may be performed on the information word bit $i_1$.

$$P_{386}=P_{386} \oplus i_1$$

$$P_{677}=P_{677} \oplus i_1$$

$$P_{705}=P_{705} \oplus i_1$$

$$P_{751}=P_{751} \oplus i_1$$

$$P_{1416}=P_{1416} \oplus i_1$$

$$P_{1570}=P_{1570} \oplus i_1 \quad (7)$$

where $i_1$ means a 1-th information word bit, $p_i$ means an i-th parity bit, and $\oplus$ means a binary operation. According to the binary operation, $1 \oplus 1$ is 0, $1 \oplus 0$ is 1, $0 \oplus 1$ is 1, and $0 \oplus 0$ is 0.

Step 4) 360-th information word bits $i_{360}$ are accumulated in parity bits having addresses of parity bits defined in a second row (that is, a row of i=1) of Table 5 as indices of the parity bits.

Step 5) 359 remaining information word bits belonging to the same group as a group to which the information word bits $i_{360}$ belong are accumulated in the parity bits. Here, an address of the parity bit may be determined based on above mathematical expression 6. However, in this case, x is an address of a parity bit accumulator corresponding to the information word bits $i_{360}$.

Step 6) the processes of Step 4 and Step 5 are repeated for all of the column groups of Table 5.

Step 7) as a result, the parity bit $p_i$ is calculated based on following mathematical expression 8. Here, i is initialized to one (1).

$$p_i=p_i \oplus p_{i-1} i=1,2,\ldots,N_{ldpc}-K_{ldpc}-1 \quad (8)$$

In above mathematical expression 8, $p_i$ means is an i-th parity bit, $N_{ldpc}$ means a length of the LDPC codeword, $K_{ldpc}$ means a length of the information word in the LDPC codeword, and $\oplus$ means a binary operation According to the binary operation, $1 \oplus 1$ is 0, $1 \oplus 0$ is 1, $0 \oplus 1$ is 1, and $0 \oplus 0$ is 0.

As a result, the parity bits may be calculated in the above-mentioned scheme.

Meanwhile, an address of a parity bit appearing in a zero (0)-th column of an i-th column group is the same as an index of a row at which one (1) is positioned in the zero (0)-th column of the i-th column group. Therefore, indices of rows at which one (1) is positioned in an i-th column of a zero (0)-th column group of Tables 2 to 15 may be represented as addresses of the parity bits in the encoding process. Therefore, Tables 2 to 15 may mean "addresses of parity bit accumulators".

As described above, in the present embodiment, the LDPC encoding process is performed in various schemes, thereby making it possible to generate the LDPC codeword.

Meanwhile, the LDPC code may be decoded using an iterative decoding algorithm based on a sum-product algorithm on a bipartite graph arranged in FIG. 2. Here, the sum-product algorithm is a kind of message passing algorithm, which is an algorithm exchanging messages through edges on the bipartite graph and calculating and updating an output message from messages input to variable nodes or check nodes.

Hereinafter, a message passing operation generally used in at the time of LDPC decoding will be described with reference to FIG. 4, according to an exemplary embodiment.

Figure 4A:
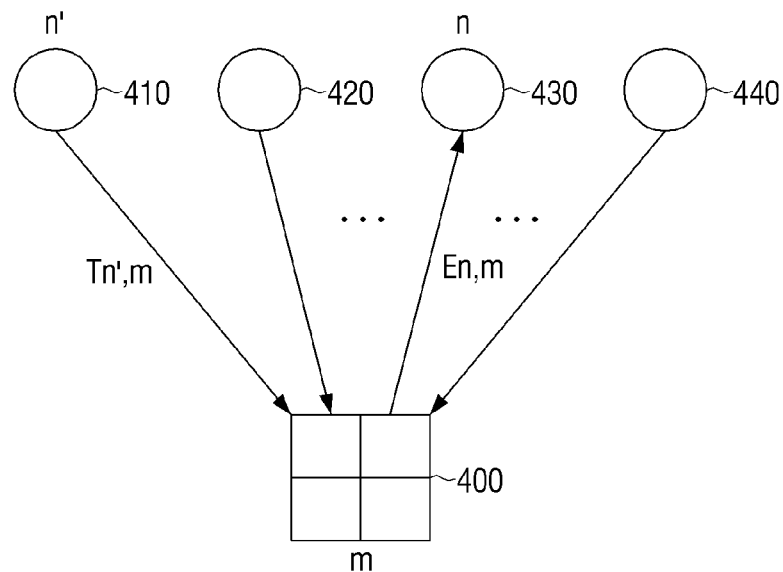
FIGS. 4A and 4B illustrate a check node and a variable node used for LDPC decoding, according to exemplary embodiments.
Figure 4B:
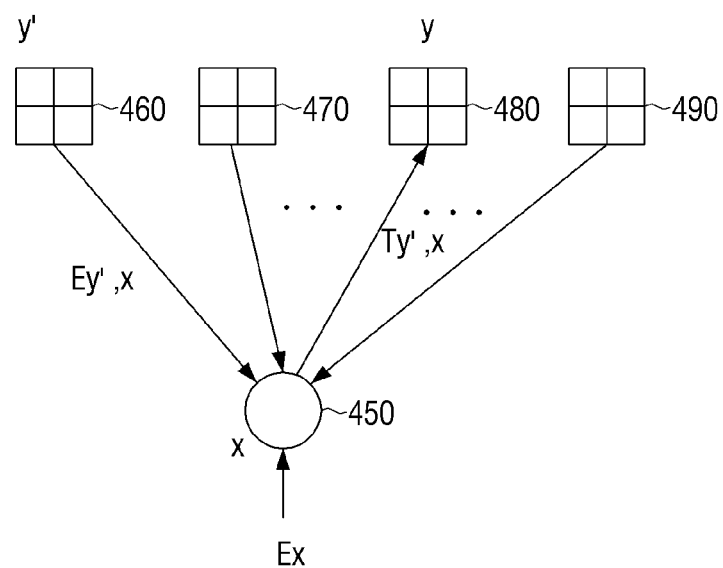

FIGS. 4A and 4B illustrate a message passing operation in any check node and any variable node for LDPC decoding.

FIG. 4A illustrates a message passing operation in any check node and any variable node of an LDPC decoding apparatus.

In FIG. 4A, a check node m 400 and a plurality of variable nodes 410, 420, 430 and 440 connected to the check node m 400 are shown. In addition, $T_{n',m}$ shown in FIG. 4A indicates a message passing from the variable node n' 410 to the check node m 400, and $E_{n,m}$ indicates a message passing from the check node m 400 to the variable node n 430. Here, a set of all variable nodes connected to the check node m 400 is defined as N(m), and a set except for the variable node n 430 in N(m) is defined as N(m)\n.

In this case, a message update rule based on the sum-product algorithm may be represented by following mathematical expressions 9.

$$|E_{n,m}| = \Phi\left[\sum_{n' \in N(m) \backslash n} \Phi(|T_{n',m}|)\right] \quad (9)$$

$$\text{Sign}(E_{n,m}) = \prod_{n' \in N(m) \backslash n} \text{sign}(T_{n',m})$$

where $\text{Sign}(E_{n,m})$ indicates a sign of the message $E_{n,m}$, and $E_{n,m}$ indicates a magnitude of the message $E_{n,m}$. Meanwhile, a function $\Phi(x)$ may be represented by following mathematical expression 10.

$$\Phi(x) = -\log\left(\tanh\left(\frac{x}{2}\right)\right) \quad (10)$$

Meanwhile, in FIG. 4B, a variable node x 450 and a plurality of check nodes 460, 470, 480 and 490 connected to the variable node 450 are shown. In addition, $E_{y',x}$ shown in FIG. 4B indicates a message passing from the check node y' 460 to the variable node x 450, and $T_{y,x}$ indicates a message passing from the variable node x 450 to the variable node y 480. Here, a set of all variable nodes connected to the variable node x 450 is defined as M(x), and a set except for the check node y 480 in M(x) is defined as M(x)\y. In this case, a message update rule based on the sum-product algorithm may be represented by following mathematical expression 11.

$$T_{y,x} = E_x + \sum_{y' \in M(x) \backslash y} E_{y',x} \quad (11)$$

Here, $E_x$ means an initial message value of the variable node x.

In addition, in the case in which a bit value of the node x is determined, it may be represented by following mathematical expression 12.

$$P_x = E_x + \sum_{y' \in M(x)} E_{y',x} \qquad (12)$$

In this case, an encoding bit corresponding to the node x may be determined depending on a value of $P_x$.

Meanwhile, since the decoding method described with reference to FIGS. 4A and 4B is a general decoding method, a detailed description thereof will be omitted. However, a method (Frank R. Kschischang, Brendan J. Frey, and Hans-Andrea Loeliger, "Factor Graphs and the Sum-Product Algorithm," IEEE TRANSACTIONS ON INFORMATION THEORY, VOL. 47, NO. 2, FEBRUARY 2001, pp 498-519) other than the method described with reference to FIG. 4 may be applied in determining a message value passing from the variable node and the check node.

Figure 5:
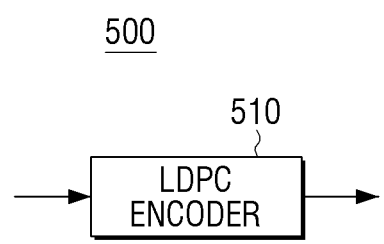
FIG. 5 is a block diagram for describing a configuration of an encoding apparatus according to an exemplary embodiment.

FIG. 5 is a block diagram showing a configuration of an encoding apparatus according to an exemplary embodiment. In this case, the encoding apparatus 500 may perform LDPC encoding described above.

As shown in FIG. 5, the encoding apparatus 500 includes an LDPC encoder 510. The LDPC encoder 510 may perform LDPC encoding on input bits based on a parity check matrix to generate an LDPC codeword. Here, the LDPC codeword may be configured of 16200 bits. That is, a length of the LDPC codeword may be 16200.

Here, the parity check matrix may have the same form as that of the parity check matrix 300 shown in FIG. 3.

In detail, the parity check matrix includes an information word sub-matrix and a parity sub-matrix.

Here, the information word sub-matrix is configured of a plurality of column groups each including M columns and is defined as a table indicating a position of a value of one (1) present in each M-th column. Here, M, which is an interval at which patterns of columns are repeated in the information word sub-matrix, may be 360. In addition, the parity sub-matrix may have a dual diagonal structure.

In this case, the LDPC encoder 510 may perform the LDPC encoding using parity check matrices differently defined depending on a code rate (that is, a code rate of the LDPC code).

For example, the LDPC encoder 510 may perform LDPC encoding using a parity check matrix defined as a table such as Table 2 or Table 6 in the case in which the code rate is 7/15 and perform LDPC encoding using a parity check matrix defined as a table such as Table 3, Table 7, Table 11 or Table 12 in the case in which the code rate is 9/15. In addition, the LDPC encoder 510 may perform LDPC encoding using a parity check matrix defined as a table such as Table 4, Table 8 or Table 13 in the case in which the code rate is 11/15 and perform LDPC encoding using a parity check matrix defined as a table such as Table 5, Table 9, Table 14 or Table 15 in the case in which the code rate is 13/15. In addition, the LDPC encoder 510 may perform LDPC encoding using a parity check matrix defined as a table such as Table 10 in the case in which the code rate is 5/15.

Meanwhile, since a detailed method for performing LDPC encoding has been described above, duplicate descriptions will be omitted.

Meanwhile, the encoding apparatus 500 may further include a memory (not shown) pre-storing information on a code rate, a codeword length, and a parity check matrix of a LDPC code therein, and the LDPC encoder 510 may perform LDPC encoding using this information. As the information on the parity check matrix, in the case in which the parity check matrix suggested in the present embodiment is used, an information word sub-matrix is configured of a plurality of column groups each including M columns and may include a table showing positions of value of one (1) present in each M-th column.

Figure 6:
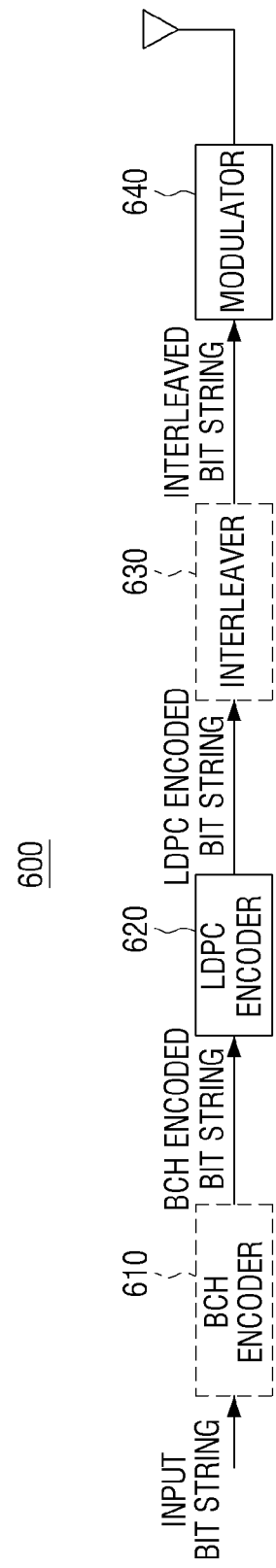
FIG. 6 is a block diagram for describing a configuration of a transmitting apparatus according to an exemplary embodiment.

FIG. 6 is a block diagram showing a configuration of a transmitting apparatus according to an exemplary embodiment. As shown in FIG. 6, the transmitting apparatus 600 may include a Bose, Chaudhuri, Hocquenghem (BCH) encoder 610, an LDPC encoder 620, an interleaver 630, and a modulator 640.

The BCH encoder 610 performs BCH encoding on input bits and outputs a BCH codeword generated by the BCH encoding to the LDPC encoder 620.

In detail, the BCH encoder 610 performs the BCH encoding on the input bits $L=[l_0, l_1, \ldots, l_{K_{bch}-1}]$ to generate $K_{ldpc}-K_{bch}$ BCH parity bits and generate a BCH codeword $I_{ldpc}=[i_0, i_1, \ldots, i_{K_{ldpc}-1}]$.

The BCH codeword $I_{ldpc}=[i_0, i_1, \ldots, i_{K_{ldpc}-1}]$, which is an information word for LDPC encoding, is input to the LDPC encoder 620. Since the BCH encoding, which is a well known technology, is disclosed in a document such as "Bose, R. C.; Ray-Chaudhuri, D. K. (March 1960), "On A Class of Error Correcting Binary Group Codes", Information and Control 3 (1): 68-79, ISSN 0890-5401", or the like, detailed descriptions thereof will be omitted.

Meanwhile, it may be changed whether or not the BCH encoder 610 is used. That is, in some cases, the BCH encoder 610 may also be omitted.

The LDPC encoder 620 performs LDPC encoding on the BCH codeword output from the BCH encoder 610 and outputs the LDPC codeword generated by the LDPC encoding to the interleaver 630.

In detail, the LDPC encoder 620 performs the LDPC encoding on the BCH codeword $I_{ldpc}=[i_0, i_1, \ldots, i_{K_{ldpc}-1}]$ output from the BCH encoder 610 so as to be an information word to generate $N_{ldpc}-K_{ldpc}$ LDPC parity bits and generate the LDPC codeword $C_{ldpc}=[c_0, c_1, \ldots, c_{N_{ldpc}-1}]$.

However, in the case in which the BCH encoder 610 is omitted, the LDPC encoder 620 may perform the LDPC encoding on the input bits.

Meanwhile, the LDPC encoder 620 of FIG. 6 may be implemented by the LDPC encoder 510 described with reference to FIG. 5. That is, the LDPC encoder 620 may perform the LDPC encoding using a parity check matrix including an information word sub-matrix defined depending on a code rate as shown in Tables 2 to 15 and a parity sub-matrix having a dual diagonal structure.

To this end, the transmitting apparatus 600 may include a memory (not shown) storing information on the parity check matrix therein. In this case, the parity check matrix may have various forms depending on the code rate, and the tables defined in Tables 2 to 15 may be an example. As the information on the parity check matrix, in the case in which the parity check matrix suggested in the present embodiment is used, an information word sub-matrix is configured of a plurality of column groups each including M columns and may include a table showing positions of value of one (1) present in each M-th column.

The interleaver 630 performs interleaving on the LDPC codeword output from the LDPC encoder 620 and output interleaved bits to the modulator 640.

In this case, the interleaver 630 receives LDPC codeword bits output from the LDPC encoder 620 and perform the interleaving in a predetermined scheme. Various interleaving schemes may be present, and it may be varied whether or not the interleaver 630 is used.

Figure 9:
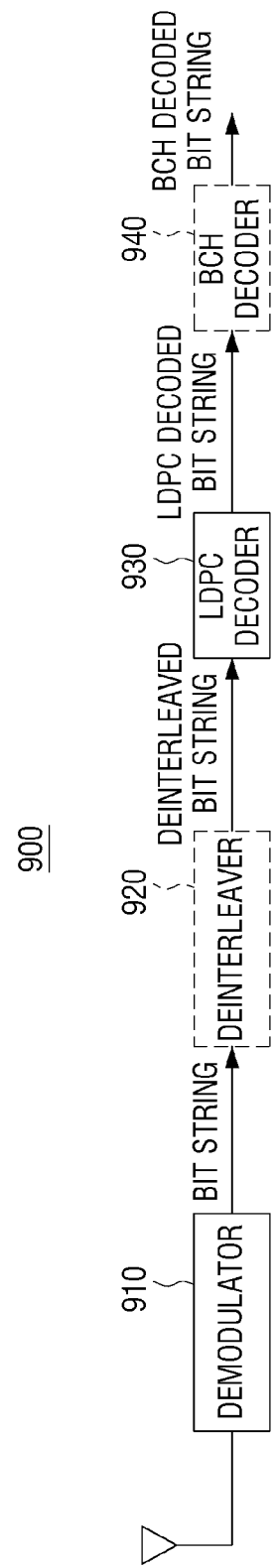
FIG. 9 is a block diagram for describing a configuration of a receiving apparatus according to an exemplary embodiment.

The modulator 640 modulates bits output from the interleaver 630 and transmits the modulated bits to a receiving apparatus (for example, 900 of FIG. 9).

In detail, the modulator 640 may demultiplex the bits output from the interleaver 630 and map the demultiplexed bits to a constellation.

That is, the modulator 640 converts bits output from the interleaver 630 in a serial-to-parallel form, thereby making it possible to generate a cell configured of a predetermined number of bits. Here, the number of bits configuring each cell may be the same as that of bits configuring a modulated symbol mapped to the constellation.

Then, the modulator 640 may map the demultiplexed bits to the constellation. That is, the modulator 640 may modulate the demultiplexed bits in various modulation schemes such as quadrature phase shift keying (QPSK), 16-quadrature amplitude modulation (QAM), 64-QAM, 256-QAM, 1024-QAM, and 4096-QAM to generate the modulated symbols and may the modulated symbols to constellation points. In this case, since the demultiplexed bits configure the cell corresponding to the modulated symbol, the respective cells may be sequentially mapped to the constellation points.

In addition, the modulator 640 may modulate a signal mapped to the constellation and transmit the modulated signal to the receiving apparatus 900. For example, the modulator 640 may map the signal mapped to the constellation to an orthogonal frequency division multiplexing (OFDM) frame in an OFDM scheme and transmit the signal to the receiving apparatus 900 through an allocated channel.

Meanwhile, the transmitting apparatus 600 may pre-store various parameters used for the encoding, the interleaving, and the modulation therein. Here, the parameter used for the encoding may be information on a code rate and a codeword length of a BCH code, and a code rate, a codeword length, and a parity check matrix of an LDPC code. In addition, the parameter used for the interleaving may be information on an interleaving rule, and the parameter used for the modulation may be information on a modulation scheme. As the information on the parity check matrix, in the case in which the parity check matrix suggested in the present embodiment is used, an information word sub-matrix is configured of a plurality of column groups each including M columns and may include a table showing positions of value of one (1) present in each M-th column.

In this case, operations of the respective components configuring the transmitting apparatus 600 may be performed using these parameters.

Meanwhile, although not shown, the transmitting apparatus 600 may further include a controller (not shown) for controlling an operation thereof in some cases.

In this case, the controller (not shown) may provide the information on the code rate and the codeword length of the BCH code to the BCH encoder 610 and provide the information on the code rate, the codeword length, and the parity check matrix of the LDPC code to the LDPC encoder 620. In addition, the controller (not shown) may provide information on the interleaving scheme to the interleaver 630 and provide information on the modulation scheme to the modulator 640. As the information on the parity check matrix, in the case in which the parity check matrix suggested in the present embodiment is used, an information word sub-matrix is configured of a plurality of column groups each including M columns and may include a table showing positions of value of one (1) present in each M-th column.

Figure 7:
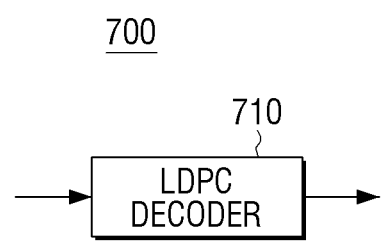
FIG. 7 is a block diagram for describing a configuration of a decoding apparatus according to an exemplary embodiment.

FIG. 7 is a block diagram showing a configuration of a decoding apparatus according to an exemplary embodiment. As shown in FIG. 7, the decoding apparatus 700 may include an LDPC decoder 710.

The LDPC decoder 710 may perform LDPC decoding on an LDPC codeword based on the parity check matrix. Here, the LDPC codeword may be configured of 16200 bits. That is, a length of the LDPC codeword may be 16200.

For example, the LDPC decoder 710 may pass a log likelihood ratio (LLR) value corresponding to LDPC codeword bits therethrough by an iterative decoding algorithm to perform the LDPC decoding, thereby generating information word bits.

Here, the LLR value, which is a channel value corresponding to the LDPC codeword bits, may be represented by various methods.

For example, the LLR value may be represented as a log value of a ratio of likelihood that bits transmitted from a transmitting side through a channel will be 0 to likelihood that the bits will be 1. In addition, the LLR value may be a bit value itself determined depending on hard decision or be a representative value determined depending on a section to which likelihood that the bits transmitted from the transmitting side will be 0 or 1 belongs.

In this case, the transmitting side may generate the LDPC codeword using the LDPC encoder 510 as shown in FIG. 5 and transmit the generated LDPC codeword.

Meanwhile, the parity check matrix used at the time of the LDPC decoding may have the same form as that of the parity check matrix 300 shown in FIG. 3.

In detail, the parity check matrix may include an information word sub-matrix and a parity sub-matrix.

Here, the information word sub-matrix is configured of a plurality of column groups each including M columns and is defined as a table showing positions of values of 1 present in each M-th column. Here, M, which is an interval between repeated column patterns in the information word sub-matrix, may be 360. In addition, the parity sub-matrix may have a dual diagonal structure.

In this case, the LDPC decoder 710 may perform the LDPC decoding using parity check matrices differently defined depending on a code rate (that is, a code rate of the LDPC code).

For example, the LDPC decoder 710 may perform the LDPC decoding using a parity check matrix defined as a table such as Table 2 or Table 6 in the case in which the code rate is 7/15 and perform the LDPC decoding using a parity check matrix defined as a table such as Table 3, Table 7, Table 11 or Table 12 in the case in which the code rate is 9/15. In addition, the LDPC decoder 710 may perform the LDPC decoding using a parity check matrix defined as a table such as Table 4, Table 8 or Table 13 in the case in which the code rate is 11/15 and perform the LDPC decoding using a parity check matrix defined as a table such as Table 5, Table 9, Table 14 or Table 15 in the case in which the code rate is 13/15. In addition, the LDPC decoder 710 may perform the LDPC decoding using a parity check matrix defined as a table such as Table 10 in the case in which the code rate is 5/15.

Figure 8:
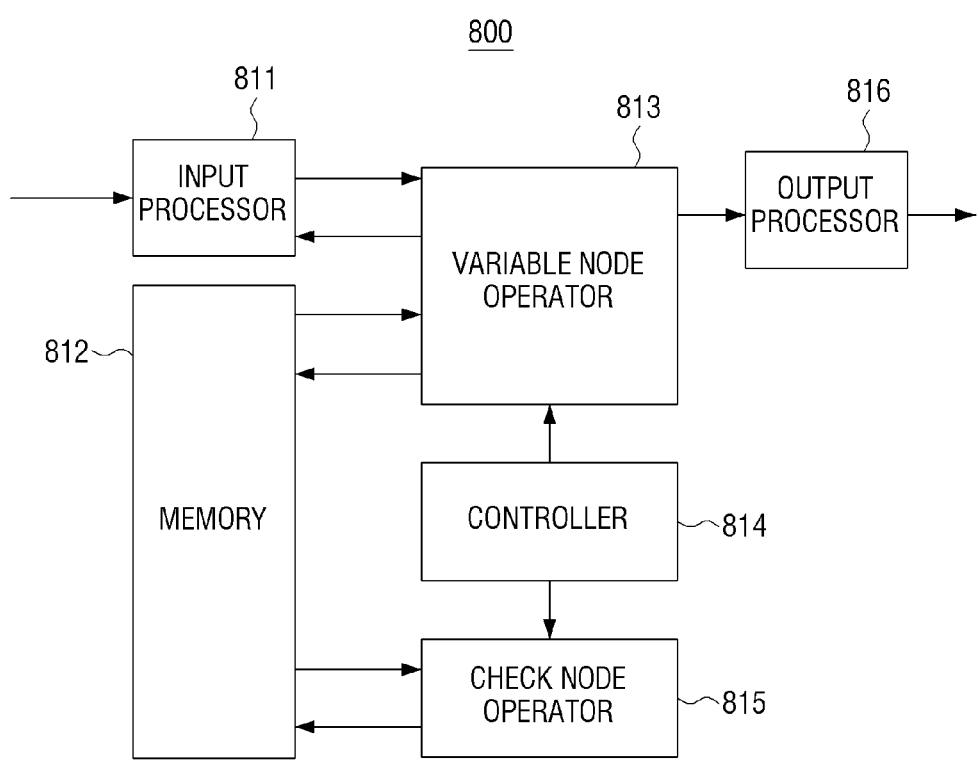
FIG. 8 is a block diagram for describing a decoding apparatus according to an exemplary embodiment.

Meanwhile, as described above, the LDPC decoder 710 may perform the LDPC decoding using the iterative decoding algorithm. In this case, the LDPC decoder 710 may have a structure as shown in FIG. 8. However, since the iterative decoding algorithm has been already known, a detailed configuration shown in FIG. 8 is only an example.

As shown in FIG. 8, the decoding apparatus 800 includes an input processor 811, a memory 812, a variable node operator 813, a controller 814, a check node operator 815, and an output processor 816.

The input processor 811 stores an input value therein. In detail, the input processor 811 stores an LLR value of a reception signal received through a radio channel.

The controller 814 determines a size of a block of the reception signal received through the radio channel, the number of values input to the variable node operator 813, an address value in the memory 812, the number of values input to the check node operator 815, an address value in the memory 812, and the like, based on a parity check matrix corresponding to a code rate.

According to an exemplary embodiment of the present embodiment, the LDPC decoder 710 may perform decoding based on a parity check matrix having a form of FIG. 3 in which indices of rows at which one (1) is positioned in the zero (0)-th column of the i-th column group are defined as shown in Tables 2 to 15.

The memory 812 stores input data and output data of the variable node operator 813 and the check node operator 815 therein.

The variable node operator 813 receives data from the memory 812 depending on information on an address of the input data and information on the number of input data received from the controller 814 and performs a variable node operation. Then, the variable node operator 813 stores variable node operation results in the memory 812 based on information on an address of the output data and information on the number of output data received from the controller 814. In addition, the variable node operator 813 inputs the variable node operation result to the output processor 816 based on data received from the input processor 811 and the memory 812. Here, the variable node operation has been described based on FIG. 4.

The check node operator 815 receives data from the memory 812 depending on information on an address of the input data and information on the number of input data received from the controller 814 and performs a check node operation. Then, the check node operator 815 stores checkl [u1] node operation results in the memory 812 depending on information of an address of the output data and information on the number of output data received from the controller 814. Here, the check node operation has been described based on FIG. 4.

The output processor 816 performs a hard decision on whether information word bits of a codeword of a transmitter are zero (0) or one (1) based on the data received from the variable node operator 813 and then outputs a result of the hard decision, and an output value of the output processor 816 becomes a finally decoded value. In this case, in FIG. 4, the hard decision may be performed based on the sum of all message values (an initial message value and the other message values input from the check nodes) input to one variable node.

Meanwhile, the decoding apparatus 700 may further include a memory (not shown) pre-storing information on a code rate, a codeword length, and a parity check matrix of an LDPC code therein, and the LDPC decoder 710 may perform the LDPC encoding using this information. However, this is only an example. That is, corresponding information may also be provided from the transmitting side. As the information on the parity check matrix, in the case in which the parity check matrix suggested in the present embodiment is used, an information word sub-matrix is configured of a plurality of column groups each including M columns and may include a table showing positions of value of one (1) present in each M-th column.

FIG. 9 is a block diagram for describing a configuration of a receiving apparatus according to an exemplary embodiment of the present invention. As shown in FIG. 9, the receiving apparatus 900 includes a demodulator 910, a deinterleaver 920, an LDPC decoder 930, and a BCH decoder 940.

The demodulator 910 receives and demodulates a signal transmitted from the transmitting apparatus 600 (See FIG. 6). In detail, the demodulator 910 may demodulate the received signal to generate values corresponding to LDPC codewords and output the values to the deinterleaver 920.

In this case, the values corresponding to the LDPC codewords may be represented by channel values for the received signal. Here, various methods for determining the channel value may be present. As an example, a method for determining an LLR value may be used.

The deinterleaver 920 performs deinterleaving on the output values of the demodulator 910 and outputs deinterleaved values to the LDPC decoder 930.

In detail, the deinterleaver 920, which is a component corresponding to the interleaver 630 of the transmitting apparatus 600, may perform an operation corresponding to the interleaver 630. That is, the deinterleaver 920 may reversely apply the interleaving scheme applied by the interleaver 630 to deinterleave the LLR values output from the demodulator 910.

However, in some cases, when the interleaver 630 is omitted in the transmitting apparatus 600, the deinterleaver 920 may be omitted.

The LDPC decoder 930 may perform LDPC decoding using the output values of the deinterleaver 920 and output LDPC decoded bits to the BCH decoder 940. Here, the LDPC decoded bits may be a BCH codeword.

In detail, the LDPC decoder 930, which is a component corresponding to the LDPC encoder 620 of the transmitting apparatus 600, may perform the LDPC decoding based on a parity check matrix. Meanwhile, the LDPC decoder 930 of FIG. 9 may be implemented by the LDPC decoder 710 described with reference to FIG. 7. That is, the LDPC decoder 930 may perform the LDPC decoding using a parity check matrix including an information word sub-matrix defined depending on a code rate as shown in Tables 2 to 15 and a parity sub-matrix having a dual diagonal structure.

The BCH decoder 940 may perform BCH decoding on the output value of the LDPC decoder 930.

In detail, the BCH decoder 940, which is a component corresponding to the BCH encoder 610 of the transmitting apparatus 600, may perform the BCH decoding on the BCH codeword output from the LDPC decoder 930 to generate the bits transmitted from the transmitting apparatus 600. However, in some cases, when the BCH encoder 610 is omitted in the transmitting apparatus 600, the BCH decoder 940 may be omitted.

Meanwhile, the receiving apparatus 900 may pre-store various parameters used for the decoding and the deinterleaving therein. Here, the parameter used for the decoding may be information on a code rate and a codeword length of a BCH code, and a code rate, a codeword length, and a parity check matrix of an LDPC code. In addition, the parameter used for the deinterleaving may be information on a deinterleaving rule. As the information on the parity check matrix, in the case in which the parity check matrix suggested in the present embodiment is used, an information word sub-matrix is configured of a plurality of column groups each including M columns and may include a table showing positions of value of one (1) present in each M-th column.

In this case, operations of the respective components configuring the receiving apparatus 900 may be performed using these parameters.

Meanwhile, although not shown, the receiving apparatus 900 may further include a controller (not shown) for controlling an operation thereof in some cases.

In this case, the controller (not shown) may provide the information on the code rate and the codeword length of the BCH code to the BCH decoder 940 and provide the information on the code rate, the codeword length, and the parity check matrix of the LDPC code to the LDPC decoder 930. In addition, the controller (not shown) may also provide information on the interleaving scheme to the deinterleaver 920. As the information on the parity check matrix, in the case in which the parity check matrix suggested in the present embodiment is used, an information word sub-matrix is configured of a plurality of column groups each including M columns and may include a table showing positions of value of one (1) present in each M-th column.

Figure 10:
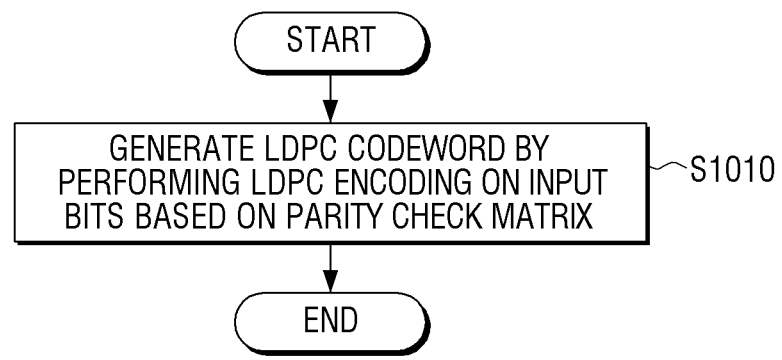
FIG. 10 is a flow chart for describing an encoding method according to an exemplary embodiment.

FIG. 10 is a flow chart for describing an encoding method according to an exemplary embodiment. In detail, FIG. 10 is a diagram for describing an encoding method of an encoding apparatus for performing LDPC encoding.

First, an LDPC codeword is generated by performing LDPC encoding on input bits based on a parity check matrix (S1010). Here, the LDPC codeword may be configured of 16200 bits. That is, a length of the LDPC codeword may be 16200.

Meanwhile, the parity check matrix may have the same form as that of the parity check matrix 300 shown in FIG. 3.

In detail, the parity check matrix may include an information word sub-matrix and a parity sub-matrix.

Here, the information word sub-matrix may be configured of a plurality of column groups each including M columns and be defined as a table showing positions of value of one (1) present in each M-th column. Here, M, which is an interval between repeated column patterns in the information word sub-matrix, may be 360. In addition, the parity sub-matrix may have a dual diagonal form.

In this case, in S1010, the LDPC encoding may be performed using parity check matrices differently defined depending on code rates.

For example, the LDPC encoding may be performed using a parity check matrix defined as a table such as Table 2 or Table 6 in the case in which the code rate is 7/15 and may be performed using a parity check matrix defined as a table such as Table 3, Table 7, Table 11 or Table 12 in the case in which the code rate is 9/15. In addition, the LDPC encoding may be performed using a parity check matrix defined as a table such as Table 4, Table 8 or Table 13 in the case in which the code rate is 11/15 and may be performed using a parity check matrix defined as a table such as Table 5, Table 9, Table 14 or Table 15 in the case in which the code rate is 13/15. In addition, the LDPC encoding may be performed using a parity check matrix defined as a table such as Table 10 in the case in which the code rate is 5/15.

Meanwhile, since a detailed method for performing the LDPC encoding has been described above, duplicate descriptions will be omitted.

Figure 11:
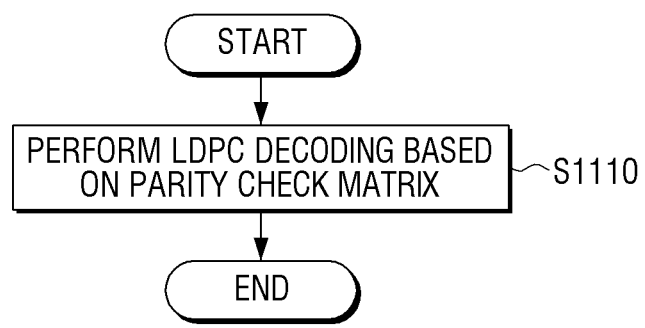
FIG. 11 is a flow chart for describing a decoding method according to an exemplary embodiment.

FIG. 11 is a flow chart for describing a decoding method according to an exemplary embodiment. In detail, FIG. 11 is a diagram for describing a decoding method of a decoding apparatus for performing LDPC decoding.

First, LDPC decoding is performed in an LDPC codeword based on a parity check matrix (S1110). Here, the LDPC codeword may be configured of 16200 bits. That is, a length of the LDPC codeword may be 16200.

For example, an LLR value corresponding to LDPC codeword bits passes by an iterative decoding algorithm to perform the LDPC decoding, thereby making it possible to generate information word bits.

Here, the LLR value, which is a channel value corresponding to the LDPC codeword bits, may be represented by various methods.

For example, the LLR value may be represented as an LLR value that bits transmitted from a transmitting side through a channel will be 0 to likelihood that the bits will be 1. In addition, the LLR value may be a bit value itself determined depending on hard decision or be a representative value determined depending on a section to which likelihood that the bits transmitted from the transmitting side will be zero (0) or one (1) belongs.

In this case, the transmitting side may generate the LDPC codeword using the LDPC encoder 510 as shown in FIG. 5 and transmit the generated LDPC codeword.

Meanwhile, the parity check matrix may have the same form as that of the parity check matrix 300 shown in FIG. 3.

In detail, the parity check matrix may include an information word sub-matrix and a parity sub-matrix.

Here, the information word sub-matrix is configured of a plurality of column groups each including M columns and is defined as a table showing positions of value of one (1) present in each M-th column. Here, M, which is an interval between repeated column patterns in the information word sub-matrix, may be 360. In addition, the parity sub-matrix may have a dual diagonal form.

In this case, in S1110, the LDPC decoding may be performed using parity check matrices differently defined depending on code rates.

For example, the LDPC decoding may be performed using a parity check matrix defined as a table such as Table 2 or Table 6 in the case in which the code rate is 7/15 and may be performed using a parity check matrix defined as a table such as Table 3, Table 7, Table 11 or Table 12 in the case in which the code rate is 9/15. In addition, the LDPC decoding may be performed using a parity check matrix defined as a table such as Table 4, Table 8 or Table 13 in the case in which the code rate is 11/15 and may be performed using a parity check matrix defined as a table such as Table 5, Table 9, Table 14 or Table 15 in the case in which the code rate is 13/15. In addition, the LDPC decoding may be performed using a parity check matrix defined as a table such as Table 10 in the case in which the code rate is 5/15.

Meanwhile, since a detailed method for performing the LDPC decoding has been described above, detailed descriptions will be omitted.

Meanwhile, a non-transitory computer readable medium in which programs for sequentially performing the encoding method and the decoding method according to an exemplary embodiment are stored may be provided.

The non-transitory computer readable medium is not a medium in which data are stored for a short moment, such as a register, a cache, a memory, or the like, but means a medium semi-permanently storing data therein and readable by a device. In detail, various applications or programs described above may be stored in and provided from the non-transitory computer readable medium such as a compact disk (CD), a digital versatile disk (DVD), a hard disk, a blu-ray disk, a universal serial bus (USB), a memory card, a read only memory (ROM), or the like.

In addition, although buses are not shown in block diagrams showing the encoding apparatus, the decoding apparatus, the transmitting apparatus, and the receiving apparatus, communication between the respective components in the encoding apparatus, the decoding apparatus, the transmitting apparatus, and the receiving apparatus may also be performed through the buses.

Components, elements or units represented by a block as illustrated in FIGS. 5-9 may be embodied as the various numbers of hardware, software and/or firmware structures that execute respective functions described above, according to exemplary embodiments. For example, these components, elements or units may use a direct circuit structure, such as a memory, processing, logic, a look-up table, etc. that may execute the respective functions through controls of one or more microprocessors or other control apparatuses. These components, elements or units may be specifically embodied by a module, a program, or a part of code, which contains one or more executable instructions for performing specified logic functions. Also, at least one of the above components, elements or units may further include a processor such as a central processing unit (CPU) that performs the respective functions, a microprocessor, or the like.

As set forth above, according to various exemplary embodiments, LDPC encoding and decoding performance may be improved.

Further, although various exemplary embodiments of the inventive concept have been disclosed for illustrative purposes, those skilled in the art will appreciate that various modifications, additions and substitutions are possible, without departing from the scope and spirit of the inventive concept as disclosed in the accompanying claims. Accordingly, such modifications, additions and substitutions should also be understood to fall within the scope of the inventive concept.

What is claimed is:

1. An encoding apparatus for performing low density parity check (LDPC) encoding, comprising:
  an LDPC encoder configured to generate an LDPC codeword formed of 16200 bits by performing the LDPC encoding on input bits based on a parity check matrix,
  wherein the parity check matrix includes an information word sub-matrix and a parity sub-matrix, and
  wherein the information word sub-matrix comprises a plurality of column groups each including 360 columns and being defined as a table indicating positions of one (1) present in each 360-th column,
  wherein the LDPC encoder is configured to perform the LDPC encoding using the parity check matrix defined as a following table when a code rate of an LDPC code is 7/15:

| i | Indices of rows at which 1s are positioned in 0-th column of i-th column group |
|---|---|
| 0 | 432 655 893 942 1285 1427 1738 2199 2441 2565 2932 3201 4144 4419 4678 4963 5423 5922 6433 6564 6656 7478 7514 7892 |
| 1 | 220 453 690 826 1116 1425 1488 1901 3119 3182 3568 3800 3953 4071 4782 5038 5555 6836 6871 7131 7609 7850 8317 8443 |
| 2 | 300 454 497 930 1757 2145 2314 2372 2467 2819 3191 3256 3699 3984 4538 4965 5461 5742 5912 6135 6649 7636 8078 8455 |
| 3 | 24 65 565 609 990 1319 1394 1465 1918 1976 2463 2987 3330 3677 4195 4240 4947 5372 6453 6950 7066 8412 8500 8599 |
| 4 | 1373 4668 5324 7777 |
| 5 | 189 3930 5766 6877 |
| 6 | 3 2961 4207 5747 |
| 7 | 1108 4768 6743 7106 |
| 8 | 1282 2274 2750 6204 |
| 9 | 2279 2587 2737 6344 |
| 10 | 2889 3164 7275 8040 |
| 11 | 133 2734 5081 8386 |
| 12 | 437 3203 7121 |
| 13 | 4280 7128 8490 |
| 14 | 619 4563 6206 |
| 15 | 2799 6814 6991 |
| 16 | 244 4212 5925 |
| 17 | 1719 7657 8554 |
| 18 | 53 1895 6685 |
| 19 | 584 5420 6856 |
| 20 | 2958 5834 8103. |

2. An encoding apparatus for performing low density parity check (LDPC) encoding, comprising:
  an LDPC encoder configured to generate an LDPC codeword formed of 16200 bits by performing the LDPC encoding on input bits based on a parity check matrix,
  wherein the parity check matrix includes an information word sub-matrix and a parity sub-matrix, and
  wherein the information word sub-matrix comprises a plurality of column groups each including 360 columns and being defined as a table indicating positions of one (1) present in each 360-th column,
  wherein the LDPC encoder is configured to perform the LDPC encoding using the parity check matrix defined as a following table when a code rate of an LDPC code is 5/15:

| i | Indices of rows at which 1s are positioned in 0-th column of i-th column group |
|---|---|
| 0 | 245 449 491 980 1064 1194 1277 1671 2026 3186 4399 4900 5283 5413 5558 6570 7492 7768 7837 7984 8306 8483 8685 9357 9642 10045 10179 10261 10338 10412 |
| 1 | 1318 1584 1682 1860 1954 2000 2062 3387 3441 3879 3931 4240 4302 4446 4603 5117 5588 5675 5793 5955 6097 6221 6449 6616 7218 7394 9535 9896 10009 10763 |
| 2 | 105 472 785 911 1168 1450 2550 2851 3277 3624 4128 4460 4572 4669 4783 5102 5133 5199 5905 6647 7028 7086 7703 8121 8217 9149 9304 9476 9736 9884 |
| 3 | 1217 5338 5737 8334 |
| 4 | 855 994 2979 9443 |
| 5 | 7506 7811 9212 9982 |
| 6 | 848 3313 3380 3990 |
| 7 | 2095 4113 4620 9946 |
| 8 | 1488 2396 6130 7483 |
| 9 | 1002 2241 7067 10418 |
| 10 | 2008 3199 7215 7502 |
| 11 | 1161 7705 8194 8534 |
| 12 | 2316 4803 8649 9359 |
| 13 | 125 1880 3177 |
| 14 | 1141 8033 9072. |

3. An encoding apparatus for performing low density parity check (LDPC) encoding, comprising:
  an LDPC encoder configured to generate an LDPC codeword formed of 16200 bits by performing the LDPC encoding on input bits based on a parity check matrix,
  wherein the parity check matrix includes an information word sub-matrix and a parity sub-matrix, and
  wherein the information word sub-matrix comprises a plurality of column groups each including 360 columns and being defined as a table indicating positions of one (1) present in each 360-th column,
  wherein the LDPC encoder is configured to perform the LDPC encoding using the parity check matrix defined as a following table when a code rate of an LDPC code is 9/15:

| i | Indices of rows at which 1s are positioned in 0-th column of i-th column group |
|---|---|
| 0 | 350 462 1291 1383 1821 2235 2493 3328 3353 3772 3872 3923 4259 4426 4542 4972 5347 6217 6246 6332 6386 |
| 1 | 177 869 1214 1253 1398 1482 1737 2014 2161 2331 3108 3297 3438 4388 4430 4456 4522 4783 5273 6037 6395 |
| 2 | 347 501 658 966 1622 1659 1934 2117 2527 3168 3231 3379 3427 3739 4218 4497 4894 5000 5167 5728 5975 |
| 3 | 319 398 599 1143 1796 3198 3521 3886 4139 4453 4556 4636 4688 4753 4986 5199 5224 5496 5698 5724 6123 |
| 4 | 162 257 304 524 945 1695 1855 2527 2780 2902 2958 3439 3484 4224 4769 4928 5156 5303 5971 6358 6477 |
| 5 | 807 1695 2941 4276 |
| 6 | 2652 2857 4660 6358 |
| 7 | 329 2100 2412 3632 |
| 8 | 1151 1231 3872 4869 |
| 9 | 1561 3565 5138 5303 |
| 10 | 407 794 1455 |
| 11 | 3438 5683 5749 |
| 12 | 1504 1985 3563 |
| 13 | 440 5021 6321 |
| 14 | 194 3645 5923 |
| 15 | 1217 1462 6422 |
| 16 | 1212 4715 5973 |
| 17 | 4098 5100 5642 |
| 18 | 5512 5857 6226 |
| 19 | 2583 5506 5933 |
| 20 | 784 1801 4890 |
| 21 | 4734 4779 4875 |
| 22 | 938 5081 5377 |
| 23 | 127 4125 4704 |
| 24 | 1244 2178 3352 |
| 25 | 3659 6350 6465 |
| 26 | 1686 3464 4336. |

4. An encoding apparatus for performing low density parity check (LDPC) encoding, comprising:
an LDPC encoder configured to generate an LDPC codeword formed of 16200 bits by performing the LDPC encoding on input bits based on a parity check matrix,
wherein the parity check matrix includes an information word sub-matrix and a parity sub-matrix, and
wherein the information word sub-matrix comprises a plurality of column groups each including 360 columns and being defined as a table indicating positions of one (1) present in each 360-th column,
wherein the LDPC encoder is configured to perform the LDPC encoding using the parity check matrix defined as a following table when a code rate of an LDPC code is 11/15:

| i | Indices of rows at which 1s are positioned in 0-th column of i-th column group |
|---|---|
| 0 | 108 297 703 742 1345 1443 1495 1628 1812 2341 2559 2669 2810 2877 3442 3690 3755 3904 4264 |
| 1 | 180 211 477 788 824 1090 1272 1578 1685 1948 2050 2195 2233 2546 2757 2946 3147 3299 3544 |
| 2 | 627 741 1135 1157 1226 1333 1378 1427 1454 1696 1757 1772 2099 2208 2592 3354 3580 4066 4242 |
| 3 | 9 795 959 989 1006 1032 1135 1209 1382 1484 1703 1855 1985 2043 2629 2845 3136 3450 3742 |
| 4 | 230 413 801 829 1108 1170 1291 1759 1793 1827 1976 2000 2423 2466 2917 3010 3600 3782 4143 |
| 5 | 56 142 236 381 1050 1141 1372 1627 1985 2247 2340 3023 3434 3519 3957 4013 4142 4164 4279 |
| 6 | 298 1211 2548 3643 |
| 7 | 73 1070 1614 1748 |
| 8 | 1439 2141 3614 |
| 9 | 284 1564 2629 |
| 10 | 607 660 855 |
| 11 | 1195 2037 2753 |
| 12 | 49 1198 2562 |
| 13 | 296 1145 3540 |
| 14 | 1516 2315 2382 |
| 15 | 154 722 4016 |
| 16 | 759 2375 3825 |
| 17 | 162 194 1749 |
| 18 | 2335 2422 2632 |
| 19 | 6 1172 2583 |
| 20 | 726 1325 1428 |
| 21 | 985 2708 2769 |
| 22 | 255 2801 3181 |
| 23 | 2979 3720 4090 |
| 24 | 208 1428 4094 |
| 25 | 199 3743 3757 |
| 26 | 1229 2059 4282 |
| 27 | 458 1100 1387 |
| 28 | 1199 2481 3284 |
| 29 | 1161 1467 4060 |
| 30 | 959 3014 4144 |
| 31 | 2666 3960 4125 |
| 32 | 2809 3834 4318. |

5. An encoding apparatus for performing low density parity check (LDPC) encoding, comprising:
an LDPC encoder configured to generate an LDPC codeword formed of 16200 bits by performing the LDPC encoding on input bits based on a parity check matrix,
wherein the parity check matrix includes an information word sub-matrix and a parity sub-matrix, and
wherein the information word sub-matrix comprises a plurality of column groups each including 360 columns and being defined as a table indicating positions of one (1) present in each 360-th column,
wherein the LDPC encoder is configured to perform the LDPC encoding using the parity check matrix defined as a following table when the code rate of an LDPC code is 13/15:

| i | Indices of rows at which 1s are positioned in 0-th column of i-th column group |
|---|---|
| 0 | 37 144 161 199 220 496 510 589 731 808 834 965 1249 1264 1311 1377 1460 1520 1598 1707 1958 2055 2099 2154 |
| 1 | 20 27 165 462 546 583 742 796 1095 1110 1129 1145 1169 1190 1254 1363 1383 1463 1718 1835 1870 1879 2108 2128 |
| 2 | 288 362 463 505 638 691 745 861 1006 1083 1124 1175 1247 1275 1337 1353 1378 1506 1588 1632 1720 1868 1980 2135 |
| 3 | 405 464 478 511 566 574 641 766 785 802 836 996 1128 1239 1247 1449 1491 1537 1616 1643 1668 1950 1975 2149 |
| 4 | 86 192 245 357 363 374 700 713 852 903 992 1174 1245 1277 1342 1369 1381 1417 1463 1712 1900 1962 2053 2118 |
| 5 | 101 327 378 550 |
| 6 | 186 723 1318 1550 |
| 7 | 118 277 504 1835 |
| 8 | 199 407 1776 1965 |
| 9 | 387 1253 1328 1975 |
| 10 | 62 144 1163 2017 |
| 11 | 100 475 572 2136 |
| 12 | 431 865 1568 2055 |
| 13 | 283 640 981 1172 |
| 14 | 220 1038 1903 2147 |
| 15 | 483 1318 1358 2118 |
| 16 | 92 961 1709 1810 |
| 17 | 112 403 1485 2042 |
| 18 | 431 1110 1130 1365 |
| 19 | 587 1005 1206 1588 |
| 20 | 704 1113 1943 |
| 21 | 375 1487 2100 |
| 22 | 1507 1950 2110 |
| 23 | 962 1613 2038 |
| 24 | 554 1295 1501 |
| 25 | 488 784 1446 |

| i | Indices of rows at which 1s are positioned in 0-th column of i-th column group |
|---|---|
| 26 | 871 1935 1964 |
| 27 | 54 1475 1504 |
| 28 | 1579 1617 2074 |
| 29 | 1856 1967 2131 |
| 30 | 330 1582 2107 |
| 31 | 40 1056 1809 |
| 32 | 1310 1353 1410 |
| 33 | 232 554 1939 |
| 34 | 168 641 1099 |
| 35 | 333 437 1556 |
| 36 | 153 622 745 |
| 37 | 719 931 1188 |
| 38 | 237 638 1607. |

6. An encoding method for performing LDPC encoding, comprising:

generating an LDPC codeword formed of 16200 bits by performing the LDPC encoding on input bits based on a parity check matrix, wherein the parity check matrix includes an information word sub-matrix and a parity sub-matrix, and wherein the information word sub-matrix comprises a plurality of column groups each including 360 columns and being defined as a table indicating positions of one (1) present in each 360-th column, wherein in the generating the LDPC codeword, the LDPC encoding is performed using the parity check matrix defined as a following table when a code rate of an LDPC code is 7/15:

| i | Indices of rows at which 1s are positioned in 0-th column of i-th column group |
|---|---|
| 0 | 432 655 893 942 1285 1427 1738 2199 2441 2565 2932 3201 4144 4419 4678 4963 5423 5922 6433 6564 6656 7478 7514 7892 |
| 1 | 220 453 690 826 1116 1425 1488 1901 3119 3182 3568 3800 3953 4071 4782 5038 5555 6836 6871 7131 7609 7850 8317 8443 |
| 2 | 300 454 497 930 1757 2145 2314 2372 2467 2819 3191 3256 3699 3984 4538 4965 5461 5742 5912 6135 6649 7636 8078 8455 |
| 3 | 24 65 565 609 990 1319 1394 1465 1918 1976 2463 2987 3330 3677 4195 4240 4947 5372 6453 6950 7066 8412 8500 8599 |
| 4 | 1373 4668 5324 7777 |
| 5 | 189 3930 5766 6877 |
| 6 | 3 2961 4207 5747 |
| 7 | 1108 4768 6743 7106 |
| 8 | 1282 2274 2750 6204 |
| 9 | 2279 2587 2737 6344 |
| 10 | 2889 3164 7275 8040 |
| 11 | 133 2734 5081 8386 |
| 12 | 437 3203 7121 |
| 13 | 4280 7128 8490 |
| 14 | 619 4563 6206 |
| 15 | 2799 6814 6991 |
| 16 | 244 4212 5925 |
| 17 | 1719 7657 8554 |
| 18 | 53 1895 6685 |
| 19 | 584 5420 6856 |
| 20 | 2958 5834 8103. |

7. An encoding method for performing LDPC encoding, comprising:

generating an LDPC codeword formed of 16200 bits by performing the LDPC encoding on input bits based on a parity check matrix, wherein the parity check matrix includes an information word sub-matrix and a parity sub-matrix, and wherein the information word sub-matrix comprises a plurality of column groups each including 360 columns and being defined as a table indicating positions of one (1) present in each 360-th column, wherein in the generating the LDPC codeword, the LDPC encoding is performed using the parity check matrix defined as a following table when a code rate of an LDPC code is 5/15:

| i | Indices of rows at which 1s are positioned in 0-th column of i-th column group |
|---|---|
| 0 | 245 449 491 980 1064 1194 1277 1671 2026 3186 4399 4900 5283 5413 5558 6570 7492 7768 7837 7984 8306 8483 8685 9357 9642 10045 10179 10261 10338 10412 |
| 1 | 1318 1584 1682 1860 1954 2000 2062 3387 3441 3879 3931 4240 4302 4446 4603 5117 5588 5675 5793 5955 6097 6221 6449 6616 7218 7394 9535 9896 10009 10763 |
| 2 | 105 472 785 911 1168 1450 2550 2851 3277 3624 4128 4460 4572 4669 4783 5102 5133 5199 5905 6647 7028 7086 7703 8121 8217 9149 9304 9476 9736 9884 |
| 3 | 1217 5338 5737 8334 |
| 4 | 855 994 2979 9443 |
| 5 | 7506 7811 9212 9982 |
| 6 | 848 3313 3380 3990 |
| 7 | 2095 4113 4620 9946 |
| 8 | 1488 2396 6130 7483 |
| 9 | 1002 2241 7067 10418 |
| 10 | 2008 3199 7215 7502 |
| 11 | 1161 7705 8194 8534 |
| 12 | 2316 4803 8649 9359 |
| 13 | 125 1880 3177 |
| 14 | 1141 8033 9072. |

8. An encoding method for performing LDPC encoding, comprising:

generating an LDPC codeword formed of 16200 bits by performing the LDPC encoding on input bits based on a parity check matrix, wherein the parity check matrix includes an information word sub-matrix and a parity sub-matrix, and wherein the information word sub-matrix comprises a plurality of column groups each including 360 columns and being defined as a table indicating positions of one (1) present in each 360-th column, wherein in the generating the LDPC codeword, the LDPC encoding is performed using the parity check matrix defined as a following table when a code rate of an LDPC code is 9/15:

| i | Indices of rows at which 1s are positioned in 0-th column of i-th column group |
|---|---|
| 0 | 350 462 1291 1383 1821 2235 2493 3328 3353 3772 3872 3923 4259 4426 4542 4972 5347 6217 6246 6332 6386 |
| 1 | 177 869 1214 1253 1398 1482 1737 2014 2161 2331 3108 3297 3438 4388 4430 4456 4522 4783 5273 6037 6395 |
| 2 | 347 501 658 966 1622 1659 1934 2117 2527 3168 3231 3379 3427 3739 4218 4497 4894 5000 5167 5728 5975 |
| 3 | 319 398 599 1143 1796 3198 3521 3886 4139 4453 4556 4636 4688 4753 4986 5199 5224 5496 5698 5724 6123 |
| 4 | 162 257 304 524 945 1695 1855 2527 2780 2902 2958 3439 3484 4224 4769 4928 5156 5303 5971 6358 6477 |
| 5 | 807 1695 2941 4276 |
| 6 | 2652 2857 4660 6358 |
| 7 | 329 2100 2412 3632 |
| 8 | 1151 1231 3872 4869 |
| 9 | 1561 3565 5138 5303 |
| 10 | 407 794 1455 |
| 11 | 3438 5683 5749 |
| 12 | 1504 1985 3563 |
| 13 | 440 5021 6321 |
| 14 | 194 3645 5923 |
| 15 | 1217 1462 6422 |
| 16 | 1212 4715 5973 |

-continued

| i | Indices of rows at which 1s are positioned in 0-th column of i-th column group |
|---|---|
| 17 | 4098 5100 5642 |
| 18 | 5512 5857 6226 |
| 19 | 2583 5506 5933 |
| 20 | 784 1801 4890 |
| 21 | 4734 4779 4875 |
| 22 | 938 5081 5377 |
| 23 | 127 4125 4704 |
| 24 | 1244 2178 3352 |
| 25 | 3659 6350 6465 |
| 26 | 1686 3464 4336. |

9. An encoding method for performing LDPC encoding, comprising:
generating an LDPC codeword formed of 16200 bits by performing the LDPC encoding on input bits based on a parity check matrix,
wherein the parity check matrix includes an information word sub-matrix and a parity sub-matrix, and
wherein the information word sub-matrix comprises a plurality of column groups each including 360 columns and being defined as a table indicating positions of one (1) present in each 360-th column,
wherein in the generating the LDPC codeword, the LDPC encoding is performed using the parity check matrix defined as a following table when a code rate of an LDPC code is 11/15:

| i | Indices of rows at which 1s are positioned in 0-th column of i-th column group |
|---|---|
| 0 | 108 297 703 742 1345 1443 1495 1628 1812 2341 2559 2669 2810 2877 3442 3690 3755 3904 4264 |
| 1 | 180 211 477 788 824 1090 1272 1578 1685 1948 2050 2195 2233 2546 2757 2946 3147 3299 3544 |
| 2 | 627 741 1135 1157 1226 1333 1378 1427 1454 1696 1757 1772 2099 2208 2592 3354 3580 4066 4242 |
| 3 | 9 795 959 989 1006 1032 1135 1209 1382 1484 1703 1855 1985 2043 2629 2845 3136 3450 3742 |
| 4 | 230 413 801 829 1108 1170 1291 1759 1793 1827 1976 2000 2423 2466 2917 3010 3600 3782 4143 |
| 5 | 56 142 236 381 1050 1141 1372 1627 1985 2247 2340 3023 3434 3519 3957 4013 4142 4164 4279 |
| 6 | 298 1211 2548 3643 |
| 7 | 73 1070 1614 1748 |
| 8 | 1439 2141 3614 |
| 9 | 284 1564 2629 |
| 10 | 607 660 855 |
| 11 | 1195 2037 2753 |
| 12 | 49 1198 2562 |
| 13 | 296 1145 3540 |
| 14 | 1516 2315 2382 |
| 15 | 154 722 4016 |
| 16 | 759 2375 3825 |
| 17 | 162 194 1749 |
| 18 | 2335 2422 2632 |
| 19 | 6 1172 2583 |
| 20 | 726 1325 1428 |
| 21 | 985 2708 2769 |
| 22 | 255 2801 3181 |
| 23 | 2979 3720 4090 |
| 24 | 208 1428 4094 |
| 25 | 199 3743 3757 |
| 26 | 1229 2059 4282 |
| 27 | 458 1100 1387 |
| 28 | 1199 2481 3284 |
| 29 | 1161 1467 4060 |
| 30 | 959 3014 4144 |
| 31 | 2666 3960 4125 |
| 32 | 2809 3834 4318. |

10. An encoding method for performing LDPC encoding, comprising:
generating an LDPC codeword formed of 16200 bits by performing the LDPC encoding on input bits based on a parity check matrix,
wherein the parity check matrix includes an information word sub-matrix and a parity sub-matrix, and
wherein the information word sub-matrix comprises a plurality of column groups each including 360 columns and being defined as a table indicating positions of one (1) present in each 360-th column,
wherein in the generating the LDPC codeword, the LDPC encoding is performed using the parity check matrix defined as a following table when a code rate of an LDPC code is 13/15:

| i | Indices of rows at which 1s are positioned in 0-th column of i-th column group |
|---|---|
| 0 | 37 144 161 199 220 496 510 589 731 808 834 965 1249 1264 1311 1377 1460 1520 1598 1707 2055 2099 2154 |
| 1 | 20 27 165 462 546 583 742 796 1095 1110 1129 1145 1169 1190 1254 1363 1383 1463 1718 1835 1870 1879 2108 2128 |
| 2 | 288 362 463 505 638 691 745 861 1006 1083 1124 1175 1247 1275 1337 1353 1378 1506 1588 1632 1720 1868 1980 2135 |
| 3 | 405 464 478 511 566 574 641 766 785 802 836 996 1128 1239 1247 1449 1491 1537 1616 1643 1668 1950 1975 2149 |
| 4 | 86 192 245 357 363 374 700 713 852 903 992 1174 1245 1277 1342 1369 1381 1417 1463 1712 1900 1962 2053 2118 |
| 5 | 101 327 378 550 |
| 6 | 186 723 1318 1550 |
| 7 | 118 277 504 1835 |
| 8 | 199 407 1776 1965 |
| 9 | 387 1253 1328 1975 |
| 10 | 62 144 1163 2017 |
| 11 | 100 475 572 2136 |
| 12 | 431 865 1568 2055 |
| 13 | 283 640 981 1172 |
| 14 | 220 1038 1903 2147 |
| 15 | 483 1318 1358 2118 |
| 16 | 92 961 1709 1810 |
| 17 | 112 403 1485 2042 |
| 18 | 431 1110 1130 1365 |
| 19 | 587 1005 1206 1588 |
| 20 | 704 1113 1943 |
| 21 | 375 1487 2100 |
| 22 | 1507 1950 2110 |
| 23 | 962 1613 2038 |
| 24 | 554 1295 1501 |
| 25 | 488 784 1446 |
| 26 | 871 1935 1964 |
| 27 | 54 1475 1504 |
| 28 | 1579 1617 2074 |
| 29 | 1856 1967 2131 |
| 30 | 330 1582 2107 |
| 31 | 40 1056 1809 |
| 32 | 1310 1353 1410 |
| 33 | 232 554 1939 |
| 34 | 168 641 1099 |
| 35 | 333 437 1556 |
| 36 | 153 622 745 |
| 37 | 719 931 1188 |
| 38 | 237 638 1607. |

11. A decoding apparatus for performing LDPC decoding, comprising:
an LDPC decoder configured to perform the LDPC decoding on an LDPC codeword formed of 16200 bits based on a parity check matrix,
wherein the parity check matrix includes an information word sub-matrix and a parity sub-matrix, and
wherein the information word sub-matrix comprises a plurality of column groups each including 360 columns and being defined as a table indicating positions of one (1) present in each 360-th column, wherein the LDPC decoder is configured to perform the LDPC decoding using a parity check matrix defined as the following table when a code rate of an LDPC code is 7/15:

| i | Indices of rows at which 1s are positioned in 0-th column of i-th column group |
|---|---|
| 0 | 432 655 893 942 1285 1427 1738 2199 2441 2565 2932 3201 4144 4419 4678 4963 5423 5922 6433 6564 6656 7478 7514 7892 |
| 1 | 220 453 690 826 1116 1425 1488 1901 3119 3182 3568 3800 3953 4071 4782 5038 5555 6836 6871 7131 7609 7850 8317 8443 |
| 2 | 300 454 497 930 1757 2145 2314 2372 2467 2819 3191 3256 3699 3984 4538 4965 5461 5742 5912 6135 6649 7636 8078 8455 |
| 3 | 24 65 565 609 990 1319 1394 1465 1918 1976 2463 2987 3330 3677 4195 4240 4947 5372 6453 6950 7066 8412 8500 8599 |
| 4 | 1373 4668 5324 7777 |
| 5 | 189 3930 5766 6877 |
| 6 | 3 2961 4207 5747 |
| 7 | 1108 4768 6743 7106 |
| 8 | 1282 2274 2750 6204 |
| 9 | 2279 2587 2737 6344 |
| 10 | 2889 3164 7275 8040 |
| 11 | 133 2734 5081 8386 |
| 12 | 437 3203 7121 |
| 13 | 4280 7128 8490 |
| 14 | 619 4563 6206 |
| 15 | 2799 6814 6991 |
| 16 | 244 4212 5925 |
| 17 | 1719 7657 8554 |
| 18 | 53 1895 6685 |
| 19 | 584 5420 6856 |
| 20 | 2958 5834 8103. |

12. A decoding apparatus for performing LDPC decoding, comprising:
  A LDPC decoder configured to perform the LDPC decoding on an LDPC codeword formed of 16200 bits based on a parity check matrix,
  wherein the parity check matrix includes an information word sub-matrix and a parity sub-matrix, and
  wherein the information word sub-matrix comprises a plurality of column groups each including 360 columns and being defined as a table indicating positions of one (1) present in each 360-th column, wherein the LDPC decoder is configured to perform the LDPC decoding using the parity check matrix defined as a following table when a code rate of an LDPC code is 5/15:

| i | Indices of rows at which 1s are positioned in 0-th column of i-th column group |
|---|---|
| 0 | 245 449 491 980 1064 1194 1277 1671 2026 3186 4399 4900 5283 5413 5558 6570 7492 7768 7837 7984 8306 8483 8685 9357 9642 10045 10179 10261 10338 10412 |
| 1 | 1318 1584 1682 1860 1954 2000 2062 3387 3441 3879 3931 4240 4302 4446 4603 5117 5588 5675 5793 5955 6097 6221 6449 6616 7218 7394 9535 9896 10009 10763 |
| 2 | 105 472 785 911 1168 1450 2550 2851 3277 3624 4128 4460 4572 4669 4783 5102 5133 5199 5905 6647 7028 7086 7703 8121 8217 9149 9304 9476 9736 9884 |
| 3 | 1217 5338 5737 8334 |
| 4 | 855 994 2979 9443 |
| 5 | 7506 7811 9212 9982 |
| 6 | 848 3313 3380 3990 |
| 7 | 2095 4113 4620 9946 |
| 8 | 1488 2396 6130 7483 |
| 9 | 1002 2241 7067 10418 |
| 10 | 2008 3199 7215 7502 |
| 11 | 1161 7705 8194 8534 |
| 12 | 2316 4803 8649 9359 |
| 13 | 125 1880 3177 |
| 14 | 1141 8033 9072. |

13. A decoding apparatus for performing LDPC decoding, comprising:
  an LDPC decoder configured to perform the LDPC decoding on an LDPC codeword formed of 16200 bits based on a parity check matrix,
  wherein the parity check matrix includes an information word sub-matrix and a parity sub-matrix, and
  wherein the information word sub-matrix comprises a plurality of column groups each including 360 columns and being defined as a table indicating positions of one (1) present in each 360-th column,
  wherein the LDPC decoder is configured to perform the LDPC decoding using the parity check matrix defined as a following table when a code rate of an LDPC code is 9/15:

| i | Indices of rows at which 1s are positioned in 0-th column of i-th column group |
|---|---|
| 0 | 350 462 1291 1383 1821 2235 2493 3328 3353 3772 3872 3923 4259 4426 4542 4972 5347 6217 6246 6332 6386 |
| 1 | 177 869 1214 1253 1398 1482 1737 2014 2161 2331 3108 3297 3438 4388 4430 4456 4522 4783 5273 6037 6395 |
| 2 | 347 501 658 966 1622 1659 1934 2117 2527 3168 3231 3379 3427 3739 4218 4497 4894 5000 5167 5728 5975 |
| 3 | 319 398 599 1143 1796 3198 3521 3886 4139 4453 4556 4636 4688 4753 4986 5199 5224 5496 5698 5724 6123 |
| 4 | 162 257 304 524 945 1695 1855 2527 2780 2902 2958 3439 3484 4224 4769 4928 5156 5303 5971 6358 6477 |
| 5 | 807 1695 2941 4276 |
| 6 | 2652 2857 4660 6358 |
| 7 | 329 2100 2412 3632 |
| 8 | 1151 1231 3872 4869 |
| 9 | 1561 3565 5138 5303 |
| 10 | 407 794 1455 |
| 11 | 3438 5683 5749 |
| 12 | 1504 1985 3563 |
| 13 | 440 5021 6321 |
| 14 | 194 3645 5923 |
| 15 | 1217 1462 6422 |
| 16 | 1212 4715 5973 |
| 17 | 4098 5100 5642 |
| 18 | 5512 5857 6226 |
| 19 | 2583 5506 5933 |
| 20 | 784 1801 4890 |
| 21 | 4734 4779 4875 |
| 22 | 938 5081 5377 |
| 23 | 127 4125 4704 |
| 24 | 1244 2178 3352 |
| 25 | 3659 6350 6465 |
| 26 | 1686 3464 4336. |

14. A decoding apparatus for performing LDPC decoding, comprising:
  an LDPC decoder configured to perform the LDPC decoding on an LDPC codeword formed of 16200 bits based on a parity check matrix,
  wherein the parity check matrix includes an information word sub-matrix and a parity sub-matrix, and
  wherein the information word sub-matrix comprises a plurality of column groups each including 360 columns and being defined as a table indicating positions of one (1) present in each 360-th column,
  wherein the LDPC decoder is configured to perform the LDPC decoding using the parity check matrix defined as a following table when a code rate of an LDPC code is 11/15:

| i | Indices of rows at which 1s are positioned in 0-th column of i-th column group |
|---|---|
| 0 | 108 297 703 742 1345 1443 1495 1628 1812 2341 2559 2669 2810 2877 3442 3690 3755 3904 4264 |
| 1 | 180 211 477 788 824 1090 1272 1578 1685 1948 2050 2195 2233 2546 2757 2946 3147 3299 3544 |
| 2 | 627 741 1135 1157 1226 1333 1378 1427 1454 1696 1757 1772 2099 2208 2592 3354 3580 4066 4242 |
| 3 | 9 795 959 989 1006 1032 1135 1209 1382 1484 1703 1855 1985 2043 2629 2845 3136 3450 3742 |
| 4 | 230 413 801 829 1108 1170 1291 1759 1793 1827 1976 2000 2423 2466 2917 3010 3600 3782 4143 |
| 5 | 56 142 236 381 1050 1141 1372 1627 1985 2247 2340 3023 3434 3519 3957 4013 4142 4164 4279 |
| 6 | 298 1211 2548 3643 |
| 7 | 73 1070 1614 1748 |
| 8 | 1439 2141 3614 |
| 9 | 284 1564 2629 |
| 10 | 607 660 855 |
| 11 | 1195 2037 2753 |
| 12 | 49 1198 2562 |
| 13 | 296 1145 3540 |
| 14 | 1516 2315 2382 |
| 15 | 154 722 4016 |
| 16 | 759 2375 3825 |
| 17 | 162 194 1749 |
| 18 | 2335 2422 2632 |
| 19 | 6 1172 2583 |
| 20 | 726 1325 1428 |
| 21 | 985 2708 2769 |
| 22 | 255 2801 3181 |
| 23 | 2979 3720 4090 |
| 24 | 208 1428 4094 |
| 25 | 199 3743 3757 |
| 26 | 1229 2059 4282 |
| 27 | 458 1100 1387 |
| 28 | 1199 2481 3284 |
| 29 | 1161 1467 4060 |
| 30 | 959 3014 4144 |
| 31 | 2666 3960 4125 |
| 32 | 2809 3834 4318. |

15. A decoding apparatus for performing LDPC decoding, comprising:
an LDPC decoder configured to perform the LDPC decoding on an LDPC codeword formed of 16200 bits based on a parity check matrix,
wherein the parity check matrix includes an information word sub-matrix and a parity sub-matrix, and
wherein the information word sub-matrix comprises a plurality of column groups each including 360 columns and being defined as a table indicating positions of one (1) present in each 360-th column,
wherein the LDPC decoder is configured to perform the LDPC decoding using the parity check matrix defined as a following table when a code rate of an LDPC code is 13/15:

| i | Indices of rows at which 1s are positioned in 0-th column of i-th column group |
|---|---|
| 0 | 37 144 161 199 220 496 510 589 731 808 834 965 1249 1264 1311 1377 1460 1520 1598 1707 1958 2055 2099 2154 |
| 1 | 20 27 165 462 546 583 742 796 1095 1110 1129 1145 1169 1190 1254 1363 1383 1463 1718 1835 1870 1879 2108 2128 |
| 2 | 288 362 463 505 638 691 745 861 1006 1083 1124 1175 1247 1275 1337 1353 1378 1506 1588 1632 1720 1868 1980 2135 |
| 3 | 405 464 478 511 566 574 641 766 785 802 836 996 1128 1239 1247 1449 4191 1537 1616 1643 1668 1950 1975 2149 |
| 4 | 86 192 245 357 363 374 700 713 852 903 992 1174 1245 1277 1342 1369 1381 1417 1463 1712 1900 1962 2053 2118 |
| 5 | 101 327 378 550 |
| 6 | 186 723 1318 1550 |
| 7 | 118 277 504 1835 |

| i | Indices of rows at which 1s are positioned in 0-th column of i-th column group |
|---|---|
| 8 | 199 407 1776 1965 |
| 9 | 387 1253 1328 1975 |
| 10 | 62 144 1163 2017 |
| 11 | 100 475 572 2136 |
| 12 | 431 865 1568 2055 |
| 13 | 283 640 981 1172 |
| 14 | 220 1038 1903 2147 |
| 15 | 483 1318 1358 2118 |
| 16 | 92 961 1709 1810 |
| 17 | 112 403 1485 2042 |
| 18 | 431 1110 1130 1365 |
| 19 | 587 1005 1206 1588 |
| 20 | 704 1113 1943 |
| 21 | 375 1487 2100 |
| 22 | 1507 1950 2110 |
| 23 | 962 1613 2038 |
| 24 | 554 1295 1501 |
| 25 | 488 784 1446 |
| 26 | 871 1935 1964 |
| 27 | 54 1475 1504 |
| 28 | 1579 1617 2074 |
| 29 | 1856 1967 2131 |
| 30 | 330 1582 2107 |
| 31 | 40 1056 1809 |
| 32 | 1310 1353 1410 |
| 33 | 232 554 1939 |
| 34 | 168 641 1099 |
| 35 | 333 437 1556 |
| 36 | 153 622 745 |
| 37 | 719 931 1188 |
| 38 | 237 638 1607. |

16. A decoding method for performing LDPC decoding, comprising:
performing the LDPC decoding on an LDPC codeword formed of 16200 bits based on a parity check matrix,
wherein the parity check matrix includes an information word sub-matrix and a parity sub-matrix, and
wherein the information word sub-matrix comprises a plurality of column groups each including 360 columns and being defined as a table indicating positions of one (1) present in each 360-th column,
wherein in the performing the LDPC decoding, the LDPC decoding is performed using the parity check matrix defined as a following table when a code rate of an LDPC code is 7/15:

| i | Indices of rows at which 1s are positioned in 0-th column of i-th column group |
|---|---|
| 0 | 432 655 893 942 1285 1427 1738 2199 2441 2565 2932 3201 4144 4419 4678 4963 5423 5922 6433 6564 6656 7478 7514 7892 |
| 1 | 220 453 690 826 1116 1425 1488 1901 3119 3182 3568 3800 3953 4071 4782 5038 5555 6836 6871 7131 7609 7850 8317 8443 |
| 2 | 300 454 497 930 1757 2145 2314 2372 2467 2819 3191 3256 3699 3984 4538 4965 5461 5742 5912 6135 6649 7636 8078 8455 |
| 3 | 24 65 565 609 990 1319 1394 1465 1918 1976 2463 2987 3330 3677 4195 4240 4947 5372 6453 6950 7066 8412 8500 8599 |
| 4 | 1373 4668 5324 7777 |
| 5 | 189 3930 5766 6877 |
| 6 | 3 2961 4207 5747 |
| 7 | 1108 4768 6743 7106 |
| 8 | 1282 2274 2750 6204 |
| 9 | 2279 2587 2737 6344 |
| 10 | 2889 3164 7275 8040 |
| 11 | 133 2734 5081 8386 |
| 12 | 437 3203 7121 |
| 13 | 4280 7128 8490 |
| 14 | 619 4563 6206 |
| 15 | 2799 6814 6991 |
| 16 | 244 4212 5925 |

| i | Indices of rows at which 1s are positioned in 0-th column of i-th column group |
|---|---|
| 17 | 1719 7657 8554 |
| 18 | 53 1895 6685 |
| 19 | 584 5420 6856 |
| 20 | 2958 5834 8103. |

17. A decoding method for performing LDPC decoding, comprising:
performing the LDPC decoding on an LDPC codeword formed of 16200 bits based on a parity check matrix,
wherein the parity check matrix includes an information word sub-matrix and a parity sub-matrix, and
wherein the information word sub-matrix comprises a plurality of column groups each including 360 columns and being defined as a table indicating positions of one (1) present in each 360-th column,
wherein in the performing the LDPC decoding, the LDPC decoding is performed using the parity check matrix defined as a following table when a code rate of an LDPC code is 5/15:

| i | Indices of rows at which 1s are positioned in 0-th column of i-th column group |
|---|---|
| 0 | 245 449 491 980 1064 1194 1277 1671 2026 3186 4399 4900 5283 5413 5558 6570 7492 7768 7837 7984 8306 8483 8685 9357 9642 10045 10179 10261 10338 10412 |
| 1 | 1318 1584 1682 1860 1954 2000 2062 3387 3441 3879 3931 4240 4302 4446 4603 5117 5588 5675 5793 5955 6097 6221 6449 6616 7218 7394 9535 9896 10009 10763 |
| 2 | 105 472 785 911 1168 1450 2550 2851 3277 3624 4128 4460 4572 4669 4783 5102 5133 5199 5905 6647 7028 7086 7703 8121 8217 9149 9304 9476 9736 9884 |
| 3 | 1217 5338 5737 8334 |
| 4 | 855 994 2979 9443 |
| 5 | 7506 7811 9212 9982 |
| 6 | 848 3313 3380 3990 |
| 7 | 2095 4113 4620 9946 |
| 8 | 1488 2396 6130 7483 |
| 9 | 1002 2241 7067 10418 |
| 10 | 2008 3199 7215 7502 |
| 11 | 1161 7705 8194 8534 |
| 12 | 2316 4803 8649 9359 |
| 13 | 125 1880 3177 |
| 14 | 1141 8033 9072. |

18. A decoding method for performing LDPC decoding, comprising:
performing the LDPC decoding on an LDPC codeword formed of 16200 bits based on a parity check matrix,
wherein the parity check matrix includes an information word sub-matrix and a parity sub-matrix, and
wherein the information word sub-matrix comprises a plurality of column groups each including 360 columns and being defined as a table indicating positions of one (1) present in each 360-th column,
wherein in the performing the LDPC decoding, the LDPC decoding is performed using the parity check matrix defined as a following table when a code rate of an LDPC code is 9/15:

| i | Indices of rows at which 1s are positioned in 0-th column of i-th column group |
|---|---|
| 0 | 350 462 1291 1383 1821 2235 2493 3328 3353 3772 3872 3923 4259 4426 4542 4972 5347 6217 6246 6332 6386 |

| i | Indices of rows at which 1s are positioned in 0-th column of i-th column group |
|---|---|
| 1 | 177 869 1214 1253 1398 1482 1737 2014 2161 2331 3108 3297 3438 4388 4430 4456 4522 4783 5273 6037 6395 |
| 2 | 347 501 658 966 1622 1659 1934 2117 2527 3168 3231 3379 3427 3739 4218 4497 4894 5000 5167 5728 5975 |
| 3 | 319 398 599 1143 1796 3198 3521 3886 4139 4453 4556 4636 4688 4753 4986 5199 5224 5496 5698 5724 6123 |
| 4 | 162 257 304 524 945 1695 1855 2527 2780 2902 2958 3439 3484 4224 4769 4928 5156 5303 5971 6358 6477 |
| 5 | 807 1695 2941 4276 |
| 6 | 2652 2857 4660 6358 |
| 7 | 329 2100 2412 3632 |
| 8 | 1151 1231 3872 4869 |
| 9 | 1561 3565 5138 5303 |
| 10 | 407 794 1455 |
| 11 | 3438 5683 5749 |
| 12 | 1504 1985 3563 |
| 13 | 440 5021 6321 |
| 14 | 194 3645 5923 |
| 15 | 1217 1462 6422 |
| 16 | 1212 4715 5973 |
| 17 | 4098 5100 5642 |
| 18 | 5512 5857 6226 |
| 19 | 2583 5506 5933 |
| 20 | 784 1801 4890 |
| 21 | 4734 4779 4875 |
| 22 | 938 5081 5377 |
| 23 | 127 4125 4704 |
| 24 | 1244 2178 3352 |
| 25 | 3659 6350 6465 |
| 26 | 1686 3464 4336. |

19. A decoding method for performing LDPC decoding, comprising:
performing the LDPC decoding on an LDPC codeword formed of 16200 bits based on a parity check matrix,
wherein the parity check matrix includes an information word sub-matrix and a parity sub-matrix, and
wherein the information word sub-matrix comprises a plurality of column groups each including 360 columns and being defined as a table indicating positions of one (1) present in each 360-th column,
wherein in the performing the LDPC decoding, the LDPC decoding is performed using the parity check matrix defined as a following table when a code rate of an LDPC code is 11/15:

| i | Indices of rows at which 1s are positioned in 0-th column of i-th column group |
|---|---|
| 0 | 108 297 703 742 1345 1443 1495 1628 1812 2341 2559 2669 2810 2877 3442 3690 3755 3904 4264 |
| 1 | 180 211 477 788 824 1090 1272 1578 1685 1948 2050 2195 2233 2546 2757 2946 3147 3299 3544 |
| 2 | 627 741 1135 1157 1226 1333 1378 1427 1454 1696 1757 1772 2099 2208 2592 3354 3580 4066 4242 |
| 3 | 9 795 959 989 1006 1032 1135 1209 1382 1484 1703 1855 1985 2043 2629 2845 3136 3450 3742 |
| 4 | 230 413 801 829 1108 1170 1291 1759 1793 1827 1976 2000 2423 2466 2917 3010 3600 3782 4143 |
| 5 | 56 142 236 381 1050 1141 1372 1627 1985 2247 2340 3023 3434 3519 3957 4013 4142 4164 4279 |
| 6 | 298 1211 2548 3643 |
| 7 | 73 1070 1614 1748 |
| 8 | 1439 2141 3614 |
| 9 | 284 1564 2629 |
| 10 | 607 660 855 |
| 11 | 1195 2037 2753 |
| 12 | 49 1198 2562 |
| 13 | 296 1145 3540 |
| 14 | 1516 2315 2382 |
| 15 | 154 722 4016 |

| i | Indices of rows at which 1s are positioned in 0-th column of i-th column group |
|---|---|
| 16 | 759 2375 3825 |
| 17 | 162 194 1749 |
| 18 | 2335 2422 2632 |
| 19 | 6 1172 2583 |
| 20 | 726 1325 1428 |
| 21 | 985 2708 2769 |
| 22 | 255 2801 3181 |
| 23 | 2979 3720 4090 |
| 24 | 208 1428 4094 |
| 25 | 199 3743 3757 |
| 26 | 1229 2059 4282 |
| 27 | 458 1100 1387 |
| 28 | 1199 2481 3284 |
| 29 | 1161 1467 4060 |
| 30 | 959 3014 4144 |
| 31 | 2666 3960 4125 |
| 32 | 2809 3834 4318. |

20. A decoding method for performing LDPC decoding, comprising:

performing the LDPC decoding on an LDPC codeword formed of 16200 bits based on a parity check matrix, wherein the parity check matrix includes an information word sub-matrix and a parity sub-matrix, and wherein the information word sub-matrix comprises a plurality of column groups each including 360 columns and being defined as a table indicating positions of one (1) present in each 360-th column, wherein in the performing the LDPC decoding, the LDPC decoding is performed using the parity check matrix defined as a following table when a code rate of an LDPC code is 13/15:

| i | Indices of rows at which 1s are positioned in 0-th column of i-th column group |
|---|---|
| 0 | 37 144 161 199 220 496 510 589 731 808 834 965 1249 1264 1311 1377 1460 1520 1598 1707 1958 2055 2099 2154 |
| 1 | 20 27 165 462 546 583 742 796 1095 1110 1129 1145 1169 1190 1254 1363 1383 1463 1718 1835 1870 1879 2108 2128 |
| 2 | 288 362 463 505 638 691 745 861 1006 1083 1124 1175 1247 1275 1337 1353 1378 1506 1588 1632 1720 1868 1980 2135 |
| 3 | 405 464 478 511 566 574 641 766 785 802 836 996 1128 1239 1247 1449 1491 1537 1616 1643 1668 1950 1975 2149 |
| 4 | 86 192 245 357 363 374 700 713 852 903 992 1174 1245 1277 1342 1369 1381 1417 1463 1712 1900 1962 2053 2118 |
| 5 | 101 327 378 550 |
| 6 | 186 723 1318 1550 |
| 7 | 118 277 504 1835 |
| 8 | 199 407 1776 1965 |
| 9 | 387 1253 1328 1975 |
| 10 | 62 144 1163 2017 |
| 11 | 100 475 572 2136 |
| 12 | 431 865 1568 2055 |
| 13 | 283 640 981 1172 |
| 14 | 220 1038 1903 2147 |
| 15 | 483 1318 1358 2118 |
| 16 | 92 961 1709 1810 |
| 17 | 112 403 1485 2042 |
| 18 | 431 1110 1130 1365 |
| 19 | 587 1005 1206 1588 |
| 20 | 704 1113 1943 |
| 21 | 375 1487 2100 |
| 22 | 1507 1950 2110 |
| 23 | 962 1613 2038 |
| 24 | 554 1295 1501 |
| 25 | 488 784 1446 |
| 26 | 871 1935 1964 |
| 27 | 54 1475 1504 |
| 28 | 1579 1617 2074 |
| 29 | 1856 1967 2131 |
| 30 | 330 1582 2107 |
| 31 | 40 1056 1809 |
| 32 | 1310 1353 1410 |
| 33 | 232 554 1939 |
| 34 | 168 641 1099 |
| 35 | 333 437 1556 |
| 36 | 153 622 745 |
| 37 | 719 931 1188 |
| 38 | 237 638 1607. |

* * * * *